US012792806B2

(12) United States Patent
Bushnell

(10) Patent No.: US 12,792,806 B2
(45) Date of Patent: Nov. 10, 2026

(54) AUTOMATIC BLOCKING OF UNKNOWN SIGNALS AND GRADING OF TEST POINT SITES USING UNTESTABLE FAULT ESTIMATES TO IMPROVE IC TESTABILITY

(71) Applicant: Michael L. Bushnell, Princeton Junction, NJ (US)

(72) Inventor: Michael L. Bushnell, Princeton Junction, NJ (US)

(73) Assignee: SPECTRAL CHIP TEST RESEARCH, LLC, Princeton Junction, NJ (US)

( * ) Notice: Subject to any disclaimer, the term of this patent is extended or adjusted under 35 U.S.C. 154(b) by 525 days.

(21) Appl. No.: 18/377,095

(22) Filed: Oct. 5, 2023

(65) Prior Publication Data

US 2024/0126968 A1 Apr. 18, 2024

Related U.S. Application Data

(60) Provisional application No. 63/413,393, filed on Oct. 5, 2022.

(51) Int. Cl.
*G06F 30/333* (2020.01)
*G01R 3/00* (2006.01)
(Continued)

(52) U.S. Cl.
CPC .......... *G06F 30/333* (2020.01); *G06F 30/337* (2020.01); *G01R 3/00* (2013.01);
(Continued)

(58) Field of Classification Search
CPC ...... G06F 30/333; G06F 30/337; G06F 30/20; G06F 30/3308; G06F 30/367; G01R 3/00; G01R 31/2884
(Continued)

(56) References Cited

U.S. PATENT DOCUMENTS 6,141,782 A * 10/2000 Bombal ........... G01R 31/31813 714/728
7,437,646 B2 * 10/2008 Maruyama ....... G01R 31/31813 714/738
(Continued)

FOREIGN PATENT DOCUMENTS

CA 2187466 A1 * 4/1997 ..... G01R 31/318586
JP H08304517 A * 11/1996 ..... G01R 31/318586
(Continued)

OTHER PUBLICATIONS

Abraham, "20. Design for Testability", Department of Electrical and Computer Engineering, the University of Texas at Austin, VLSI Deisgn, Fall 2020, Nov. 5, 2020, 39 pages. (Year: 2020).*
(Continued)

*Primary Examiner* — Phallaka Kik
(74) *Attorney, Agent, or Firm* — MEAGHER EMANUEL LAKS GOLDBERG & LIAO, LLP

(57) ABSTRACT

Systems, methods, architectures, mechanisms, tools, and apparatus providing design for testability (DFT) to rapidly estimate a number of faults made untestable by a given circuit signal being either in the X/Z logic state, uncontrollable, or unobservable, and to iteratively configure mechanisms for insertion of test point structure within a circuit under test (CUT) such as a digital circuit including a large number of sequential logic, combinational logic, latches, clocking/timing devices, and the like. Various embodiments contemplate several iterations to achieve a desired testing solution, illustratively (i) a first pass to eliminate uninitialized flip-flops and latches using blockers; (ii) a second pass to estimate the number of lost faults caused by each untestable site; and (iii) a final pass to select only the most essential test point sites using measures of Entropy, Entropy Gain, and/or Entropy Derivative. All three passes employ the novel tournament structure of this invention where test
(Continued)

1000 points compete with each other and are ranked by importance. For some circuits, it is also effective to combine these three main optimization functions with the level number of logic gates (their depth in the circuit).

21 Claims, 14 Drawing Sheets

(51) Int. Cl.

| | |
|---|---|
| ***G06F 30/20*** | (2020.01) |
| ***G06F 30/3308*** | (2020.01) |
| ***G06F 30/337*** | (2020.01) |
| ***G06F 30/367*** | (2020.01) |
| *G01R 31/28* | (2006.01) |

(52) U.S. Cl.

CPC .......... *G01R 31/2884* (2013.01); *G06F 30/20* (2020.01); *G06F 30/3308* (2020.01); *G06F 30/367* (2020.01)

(58) Field of Classification Search

USPC ..... 716/136, 106, 111, 132; 703/16; 714/30, 714/733, 734

See application file for complete search history.

(56) References Cited

U.S. PATENT DOCUMENTS

| | | | | |
|---|---|---|---|---|
| 8,164,345 B2 * | 4/2012 | Bushnell | G01R 31/318583 | 714/724 |
| 2003/0149927 A1 * | 8/2003 | Wang | G06F 11/27 | 714/E11.169 |
| 2003/0154432 A1 * | 8/2003 | Scott | G01R 31/3185 | 714/724 |
| 2005/0289425 A1 * | 12/2005 | Maruyama | G06F 11/263 | 714/738 |
| 2010/0017760 A1 * | 1/2010 | Kapur | G01R 31/318544 | 716/132 |
| 2010/0102825 A1 * | 4/2010 | Bushnell | G01R 31/318583 | 29/874 |

FOREIGN PATENT DOCUMENTS

| | | | |
|---|---|---|---|
| JP | H09189748 A * | 7/1997 | |
| JP | 2002286810 A * | 10/2002 | G06F 11/263 |
| WO | WO-2010011387 A1 * | 1/2010 | G01R 31/318583 |

OTHER PUBLICATIONS

Horowitz et al., "Lecture 14: Design for Testability", Computer Systems Laboratory, Standford University, 2006, 41 pages. (Year: 2006).*

Wang, "Chapter 3: Design for testability", SynTest Technologies, Inc., Sunnyvale, California, Electronic Design Automation, 2009, pp. 97-172. (Year: 2009).*

Nelson, "Built-In Self Test, Smith Text: Chapter 14.7, Mentor Graphics: LBISTArchitect Process Guide", Auburn University, 2018, 26 pages. (Year: 2018).*

Geuzebroek, et al.; "Test Point Insertion that facilitates ATPG in reducing test time and data volume"; 10 pages.

Krishnamurthy; A Dynamic Programming Approach to the Test Point Insertion Problem; 24th ACM/IEEE Design Automation Conference, paper 36.3; pp. 695-705; 1987.

Thearling, et al.; "An Easily Computed Functional Level Testability Measure"; 1989 International Test Conference; Paper 18.3; pp. 381-390; 1989.

Tamarapalli, et al.; "Constructive Multi-Phase Test Point Insertion for Scan-Based Bist"; IEEE Computer Society, Proceedings of the International Test Conference (ITC'96), 1089-3539/96; 10 pages; 1996.

Touba, et al.; "Test Point Insertion Based on Path Tracing"; 14th VLSI Test Symposium; pp. 2-8 ; 1996.

Agrawal, Vishwani D.; "An Information Theoretic Approach to Digital Fault Testing"; IEEE Transactions on Computers, vol. C-30, No. 8; pp. 582-587; Aug. 1981.

Hayes, et al.; "Test Point Placement to Simplify Fault Detection"; IEEE Transactions on Computers, vol. c-23, No. 7, Jul. 1974; pp. 727-735.

Nakao, et al.; "Low Overhead Test Point Insertion for Scan-Based Bist"; ITC International Test Conference, Paper 14.1; 1999; pp. 348-357.

Sethuram, et al.; "Zero Cost Test Point Insertion Technique to Reduce Test Set Size and Test Generation Time for Structured ASICs"; IEEE Computer Society, 15th Asian Test Symposium (ATS'06); 2006; 8 pages.

Yoshimura, et al.; "A Test Point Insertion Method to Reduce the Number of Test Patterns"; IEEE Computer Society, Proceedings of the 11th Asian Test Symposium (ATS'02); 2002; 7 pages.

Brglez, F.; "On Testability Analysis of Combinational Networks"; 1984 IEEE International Symposium on Circuits and Systems; May 7-10, 1984; pp. 221-225.

Mester, et al.; "Spectral Entropy- Activity Classification in Adaptive Transform Coding"; IEEE Journal on Selected Areas in Communications, vol. 10, No. 5, Jun. 1992; pp. 913-917.

Yang, et al.; "Coefficient Rate and Significance Maps in Transform Coding"; IEEE, 1058-6393/98; Downloaded on Jul. 28, 2025 at 19:20:14 UTC from IEEE Xplore; 1998; pp. 1373-1377.

Yang, et al.; "Spectral Entropy, Equivalent Bandwidth and Minimum Coefficient Rate"; IEEE, 0-7803-3956-8/97, ISIT 1997, Ulm. Germany, Downloaded on Jul. 28, 2025 at 19:21:44 UTC from IEEE Xplore; Jun. 29-Jul. 4, 1997; pp. 181.

Goldstein, Lawrence H.; "Controllability/Observability Analysis of Digital Circuits"; IEEE Transactions on Circuits and Systems, vol. cas-26, No. 9, Downloaded on Jul. 28, 2025 at 19:23:51 UTC from IEEE Xplore; Sep. 1979; pp. 685-693.

Dussault, et al.; "A Testability Measure"; CH1409-2/78/0000-0113$00.75 © 1978 IEEE; pp. 113-116.

Brglez, et al.; "Applications of Testability Analysis: From ATPG to Critical Delay Path Tracing"; 1984 International Test Conference, paper 21.3; CH0284-2/0000/0705; 1984; pp. 705-712.

Geuzebroek, et al.; "Test Point Insertion for Compact Test Sets"; IEEE; ITC International Test Conference, Paper 10.4; 2000; pp. 292-301.

* cited by examiner

Blocking Test Point (BLOCKER)

| Path being traced | X/Z Fault Function |
|---|---|
|   | P (side input c) X (2 X (# uncount – 1) + 1) +<br># on fanouts +<br>P (side input nc) X 2 X # uncount |
|  | 2 X (# uncount) + # on fanouts |
|  | P (side input c) X (2 X (# uncount – 1) + 1) +<br># on fanouts +<br>P (side input nc) X 2 X # uncount |
|  | P (side input c) X (2 X (# uncount – 1) + 1) +<br># on fanouts +<br>P (side input nc) X 2 X # uncount |
|  | Left: 2 + # on fanouts Right: 2 |
|  | 1 + # on fanouts |
|   | 2 + # on fanouts |

1000

1100

1200

1300

1400

AUTOMATIC BLOCKING OF UNKNOWN SIGNALS AND GRADING OF TEST POINT SITES USING UNTESTABLE FAULT ESTIMATES TO IMPROVE IC TESTABILITY

CROSS-REFERENCE TO RELATED APPLICATION

This application claims priority to U.S. Provisional Patent Application No. 63/413,393, filed on Oct. 5, 2022, entitled AUTOMATIC BLOCKING OF UNKNOWN SIGNALS AND GRADING OF TEST POINT SITES USING UNTESTABLE FAULT ESTIMATES TO IMPROVE IC TESTABILITY, which application is incorporated herein by reference in its entirety.

FIELD OF THE DISCLOSURE

The present invention relates to testing integrated circuits, either before or after they are inserted into chip packages. In particular, this application provides an apparatus, method, and algorithm for automatically inserting the necessary hardware test structures into a digital integrated circuit including latched logic functions so as to drastically reduce the cost of testing.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Williams and Angell introduced full-scan design where test hardware is added to every flip-flop in the digital integrated circuit, as described in M. J. Williams and J. B. Angell, "Enhancing Testability of Large-Scale Integrated Circuits via Test Points and Additional Logic," IEEE Trans. on Computers, C-22 (1): 46-60, January 1973. MUXes are placed on the inputs to all flip-flops, so that they can either operate in normal functional mode or can behave as a shift register to shift in their state serially from a pin called scan input (SI) or shift out their state serially to a pin called scan output (SO) or both. Partial-scan is simply a technique where only a subset of the most difficult-to-test flip-flops receives the scan hardware. Partial-scan insertion algorithms are based on the minimum feedback vertex set, as described in S. T. Chakradhar, A. Balakrishnan, and V. D. Agrawal, "An Exact Algorithm for Selecting Partial Scan Flip-Flops," Proc. of the 31st Design Automation Conf., pp 81-86, June, 1994; K.-T. Cheng and V. D. Agrawal, "A Partial Scan Method for Sequential Circuits with Feedback," IEEE Trans. on Computers, 39(4): 544-548, April, 1990; N. Deo, "Graph Theory with Applications to Engineering and Computer Science," Prentice-Hall, Inc., 1974, Englewood Cliffs, NJ; and D. H. Younger, "Minimum Feedback Arc Sets for a Directed Graph," IEEE Trans. on Circuits and Systems, CT-10(2): 238-245, June, 1963.

Partial-scan insertion, unlike full-scan insertion, only scans a subset of the flip-flops. It can be based on testability measures, as described in M. Abramovici, J. J. Kulikowski, and R. R. Roy, "The Best Flip-Flops to Scan," Proc. of the IEEE Int'l. Test Conf., pp 166-173, 1991; V. Chickermane and J. Patel, "An Optimization Based Approach to Partial Scan Problem," Proc. of the Int'l. Test Conf., pp 377-386, October, 1990; P. S. Parikh and M. Abramovici, "Testability-Based Partial Scan Analysis," J. of Electronic Testing and Test Applications, 7(1/2): 61-70, August/October, 1995; S. Park, "A Partial Scan Design Unifying Structural Analysis and Testabilities," Int'l. J. on Electronics, 88(12): 1237-1245, December, 2001; M. S. Hsiao, G. S. Saund, E. M. Rudnick, and J. H. Patel, "Partial Scan Selection Based on Dynamic Reachability and Observability Information," Proc. of the Int'l. Conf. on VLSI Design, pp 174-180, January, 1998; X. Lin, I. Pomeranz, and S. M. Reddy, "Full Scan Fault Coverage with Partial Scan," Proc. of the IEEE Design Automation and Test in Europe, pp 468-472, 1999; I. Park, D. S. Ha, and G. Sim, "A New Method for Partial Scan Design Based on Propagation and Justification Requirements of Faults," Proc. of the IEEE Int'l. Test Conf., pp 413-422, October, 1995; fault lists, as described in V. Chickermane and J. H. Patel, "A Fault Oriented Partial Scan Design Approach," Proc. of the Int'l. Conf. on CAD, pp 400-403, November, 1991; K.-T. Cheng and V. D. Agrawal, "A Partial Scan Method for Sequential Circuits with Feedback," IEEE Trans. on Computers, 39(4): 544-548, April, 1990; V. Chickermane and J. H. Patel, "A Fault Oriented Partial Scan Design Approach," Proc. of the Int'l. Conf. on CAD, pp 400-403, November, 1991; K. S. Kim and C. R. Kime, "Partial Scan Flip-Flop Selection by Use of Empirical Testability," J. of Electronic Testing and Test Applications, 7(1/2): 47-60, August/October, 1995; P. S. Parikh and M. Abramovici, "Testability-Based Partial Scan Analysis," J. of Electronic Testing and Test Applications, 7(1/2): 61-70, August/October, 1995; Structure-based methods have been the most successful.

Test point insertion. Test point insertion (TPI) is used for both ATPG and BIST, as described in K. Balakrishnan, "A Dynamic Programming Approach to the Test Point Insertion Problem," Proc. of the Design Automation Conf., pp 195-705, June, 1987; A J Briers and K. A. E. Totton, "Random Pattern Testability by Fast Fault Simulation," Proc. of the Int'l. Test Conf., pp 274-281, 1986; M. J. Guezebroek, J. T. van der Linden, and A. J. van de Goor, "Test Point Insertion for Compact Test Sets," Proc. of the Int'l. Test Conf, pp 292-301, 2000; M. J. Guezebroek, J. T. van der Linden, and A. J. van de Goor, "Test Point Insertion that Facilitates ATPG in Reducing Test Time and Data Volume," Proc. of the Int'l. Test Conf, pp 138-147, 2002; J. P. Hayes and A. D. Friedman, "Test Point Placement to Simplify Fault Detection," Proc. of the Fault-Tolerant Computing Symp., pp 73-78, 1973; M. Nakao, S. Kobayashi, K. Hatayama, K. Iilima, and S. Terada, "Low Overhead Test Point Insertion for Scan-based BIST," Proc. of the Int'l. Test Conf, pp 348-357, 1999; B. Seiss, P. Trouborst, and M. Schulz, "Test Point Insertion for Scan-based BIST," Proc. of the European Design Automation Conf, pp 253-262, 1991; R. Sethuram, S. Wang, S. T. Chakradhar, and M. L. Bushnell, "Zero Cost Test Point Insertion Technique to Reduce Test Set Size and Test Generation Time for Structured ASICs," Proc. of the Asian Test Symp., pp 339-348, November, 2006; N. Tamarapalli and J. Rajski, "Constructive Multi-Phase Test Point Insertion for Scan-Based BIST," Proc. of the Int'l. Test Conf., pp 649-658, October, 1996; N. A. Touba and E. J. McCluskey, "Test Point Insertion Based on Path Tracing," Proc. of the VLSI Test Symp., pp 2-8, April-May, 1996; and M. Yoshimura, T. Hosokawa, and M. Ohta, "A Test Point Insertion Method to Reduce the Number of Test Patterns," Proc. of the Asian Test Symp., pp 198-203, November, 2002. SCOAP measures, as described in L. H. Goldstein and E. L.

Thigpen, "SCOAP: Sandia Controllability/Observability Analysis Program," pp 190-196, June, 1980; COP measures, as described in F. Brglez, P. Pownall, and P. Hum, "Applications of Testability Analysis: From ATPG to Critical Path Tracing," Proc. of the Int'l. Test Conf., pp 705-712, 1984; and test counting measures, as described in K. Balakrishnan, "A Dynamic Programming Approach to the Test Point Insertion Problem," Proc. of the Design Automation Conf., pp 195-705, June, 1987 and J. P. Hayes and A. D. Friedman, "Test Point Placement to Simplify Fault Detection," Proc. of the Fault-Tolerant Computing Symp., pp 73-78, 1973, are used for TPI.

Entropy. Information theory is useful in combating noise-related errors of communication. Information theoretic measures such as entropy also apply to physics (statistical mechanics), mathematics (probability theory), electrical engineering (communication theory), and computer science (algorithmic complexity). It was created in the 1940's by Claude Shannon (C. E. Shannon, "A Mathematical Theory of Communication," *Bell Syst. Tech. J.,* 1948, Bell Labs., AT&T). Equation 0 shows the general definition of entropy for a random variable (RV) X with a probability mass function (PMF)p (x). A PMF is the discrete version of a probability density function (PDF). Variable x varies over all possible values of X. Shannon entropy E is an effective measure of randomness in data. It is widely used as a measure of information in signals that have n distinct values, as described in R. Mester and U. Franke, "Spectral Entropy-Activity Classification in Adaptive Transform Coding," IEEE J. of Selected Areas in Communications, 10(5): 913-917, June, 1992; W. Yang and J. D. Gibson, "Coefficient Rate and Significance Maps in Transform Coding," Record of Thirty-First Asilomar Conf. on Signals, Systems and Computers, 2: 1373-1377, November, 1997; and W. Yang and J. D. Gibson, "Spectral Entropy, Equivalent Bandwidth and Minimum Coefficient Rate," Proc. of the Int'l. Symp. on Information Theory, pp 181, June-July 1997.

$$E = -\sum_{i=1}^{n} p_i \log_2(p_i) \text{ where } p_i = \text{probability of outcome } i \tag{0}$$

Entropy is the number of bits (information), on average, required to encode a RV. The maximum value of the entropy of a signal is 1.0, which occurs when all possibilities of the signal are equally likely. Consider an 8-input AND gate, with p (0)=p (1)=0.5 on each input. From SCOAP measures, as described in L. H. Goldstein, "Controllability/Observability Analysis of Digital Circuits," IEEE Trans. on Circuits and Systems, CAS-26(9): 685-693, September 1979, the difficulty of setting the output to a 1 is CC (1)=9, and the difficulty of setting it to a 0 is CC(0)=2. From COP measures, the probability of the output being 1 is p (1)=1/256 and p (0)=255/256. However, the entropy measure of the output, which incorporates both 0 and 1 probabilities, is 0.03687. The advantages of using entropy (see FIG. 1), rather than conventional testability measures, is that it is a single metric that more accurately reflects the information flow in the circuit, and also it can be reliably calculated using a limited number of simulation vectors.

Example 1. Consider a RV X that has a uniform distribution and has 32 equally probable outcomes. The entropy of X is:

$$H(X) = -\sum_{x=1}^{32} p_x \log_2(p_x) = -32 \times \left(\frac{1}{32}\log_2\left(\frac{1}{32}\right)\right) = 5 \text{ bits} \tag{1}$$

which agrees with the number of bits needed to describe X.

For logic circuits, each line is a RV with 2 possible outcomes—logic 0 and logic 1. Entropy of a wire is:

$$H(X) = -((1-p)\log_2(1-p) + p\log_2(p)) \tag{2}$$

where p is the probability of logic 1 occurring at a line. Equation 2 is plotted in FIG. 1 with H (X=p) on the ordinate and p on the abscissa. Maximum entropy occurs when 0 and 1 are equally likely.

Dussault proposed the first information theoretic testability measure, as described in J. A. Dussault, "A Testability Measure," Proc. of the IEEE 1978 Semiconductor Test Conf., pp 113-116, October, 1978. *Mutual information* (MI), I(X;Y), in Equation 3 is a measure of dependence between two RVs. H (X|Y) is the conditional entropy of a RV Xif we know the value of a second RV Y (see Equation 4), as described in T. Cover and J. Thomas, "Elements of Information Theory," John Wiley & Sons Inc., 2006, Hoboken, NJ. Equation 5 gives I(X;Y), the reduction in the uncertainty of X due to the knowledge of Y. I(X;Y) is 0 if X and Y are independent RVs. For binary logic, X, Y∈(0,1). Equations 6-8 show the proposed testability measures. Circuit inputs (outputs) are represented by the RV vector X(Y).

$$I(X;Y) = \sum_{\substack{x \in X \\ y \in Y}} p(x, y)\log_2\left(\frac{p(x, y)}{p(x)p(y)}\right) = I(Y;X) \tag{3}$$

$$H(X|Y) = \sum_{y \in Y} p(y)H(X|Y = y) \tag{4}$$

$$I(X;Y) = H(X) - H(X|Y) \tag{5}$$

$$\text{Observability} = \frac{1}{H(X|Y)} \tag{6}$$

$$\text{Controllability} = \frac{1}{H(Y|X)} \tag{7}$$

$$\text{Testability} = I(X;Y) \tag{8}$$

where H (X|Y) gives the uncertainty in inputs X given that outputs Y are known.

The less the uncertainty H (X|Y), the greater the amount of information about inputs reaching the outputs, implying higher observability. Equation 6 gives the observability since observability and uncertainty H (X|Y) are inversely proportional. Similarly, Equation 7 gives the controllability. Overall circuit testability is given by I(X;Y), where large values indicate high testability. No results were provided for this work.

Agrawal proposed an information theoretic approach to testing digital circuits, as described in V. D. Agrawal, "An Information Theoretic Approach to Digital Fault Testing," IEEE Transactions on Computers, C-30(8): 582-587, August, 1981, and derived the probability P (T) of detecting a stuck-at fault by a vector sequence T by analyzing the information throughput of the circuit. The probability of detecting a fault by a vector sequence T is:

$$P(T) = 1 - 2^{-H_o \times T/k} \tag{9}$$

where k is the number of lines through a circuit partition where the detectable fault exists and $H_o$ is the entropy at the output of the circuit.

Consider a 2-input AND gate with inputs i1, i2, and output Z. If the probability of logic 0 (logic 1) occurring at the inputs is 0.5 (0.5), the entropies at the inputs, i1 and i2, are:

$$H_{i1} = H_{i2} = -0.5\times\log_2(0.5) - 0.5\times\log_2(0.5) = 1.0 \tag{10}$$

Therefore, the total information present at the inputs is 1+1=2. The probability of logic 0 (logic 1) at output Z is 0.75 (0.25) and the entropy of Z is:

$$H_Z=-0.25\log_2(0.25)-0.75\log_2(0.75)=0.811 \quad (11)$$

Thus, the AND gate has information loss of 2.0-0.811=1.189. Agrawal proposed an ATPG method that reduces the loss (by increasing entropy) of information and maximizes P (T) in the circuit by adjusting the probabilities of 0 and 1 at the inputs.

Thearling and Abraham proposed information theory-based testability measures at the functional level, as described in K. Thearling and J. Abraham, "An Easily Computed Functional Level Testability Measure," Proc. of the Int'l. Test Conf, pp 381-390, October, 1989. Bushnell et al. proposed entropy as a measure for inserting test points in U.S. Pat. No. 8,164,345, *Spectral and Information Theoretic Method of Test Point, Partial-Scan, and Full-Scan Flip-Flop Insertion to Improve Integrated Circuit Testability*. This patent is hereby incorporated for reference.

Testability Measures. The classic way to estimate circuit testability is to use the Sandia Controllability Observability Analysis Program (SCOAP) testability measures, which approximate the number of circuit signals that must be set to control or observe specific signal lines. SCOAP measures were described in L. H. Goldstein and E. L. Thigpen, "SCOAP: Sandia Controllability/Observability Analysis Program," pp 190-196, June 1980. We now show how these measures provide erroneous and misleading information about large circuits.

FIG. 2 illustrates an example of erroneous SCOAP Testability of a logic circuit. Specifically, FIG. 2 depicts a comparison of SCOAP testability measures (non-italicized values) used in other test point inserters with corrected SCOAP measures (italicized values).

Many additional testability measures have been proposed, including COP, but they all suffer from the above problem of making only 1 forward and one reverse pass over the circuit. This leads to the same signal correlation problem, which causes great inaccuracy in assessing huge circuits.

SUMMARY

Various deficiencies in the prior art are addressed by systems, methods, architectures, mechanisms, tools, and apparatus providing design for testability (DFT) to rapidly estimate a number of faults made untestable by a given circuit signal being either in the X/Z logic state, uncontrollable, or unobservable, and to iteratively configure mechanisms for insertion of test point structure within a circuit under test (CUT) such as a digital circuit including a large number of sequential logic, combinational logic, latches, clocking/timing devices, and the like.

For example, a tool or method may implement several passes or iterations to achieve a desired testing solution, illustratively (i) a first pass to eliminate uninitialized flip-flops and latches using blockers; (ii) a second pass to estimate the number of lost faults caused by each untestable site; and (iii) a final pass to select only the most essential test point sites using measures of Entropy, Entropy Gain, and/or Entropy Derivative. All three passes employ the novel tournament structure of this invention where test points compete with each other and are ranked by importance. For some circuits, it is also effective to combine these three main optimization functions with the level number of logic gates (their depth in the circuit). Various embodiments use some or all of four methods for inserting DFT (design for testability) hardware, in any arbitrary order.

A method for inserting testing structure into a circuit under test (CUT) according to an embodiment may comprise: locating X/Z generator sites in the CUT to form thereby a blocker_candidates list; estimating a number of untestable faults for each X/Z generator; optimizing design for testability (DFT) hardware insertion using the estimate of the number of untestable faults due to X/Z generators as an optimization cost function; and inserting appropriate testing structure into one or more test point locations of the CUT.

Additional objects, advantages, and novel features of the invention will be set forth in part in the description which follows and will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1:
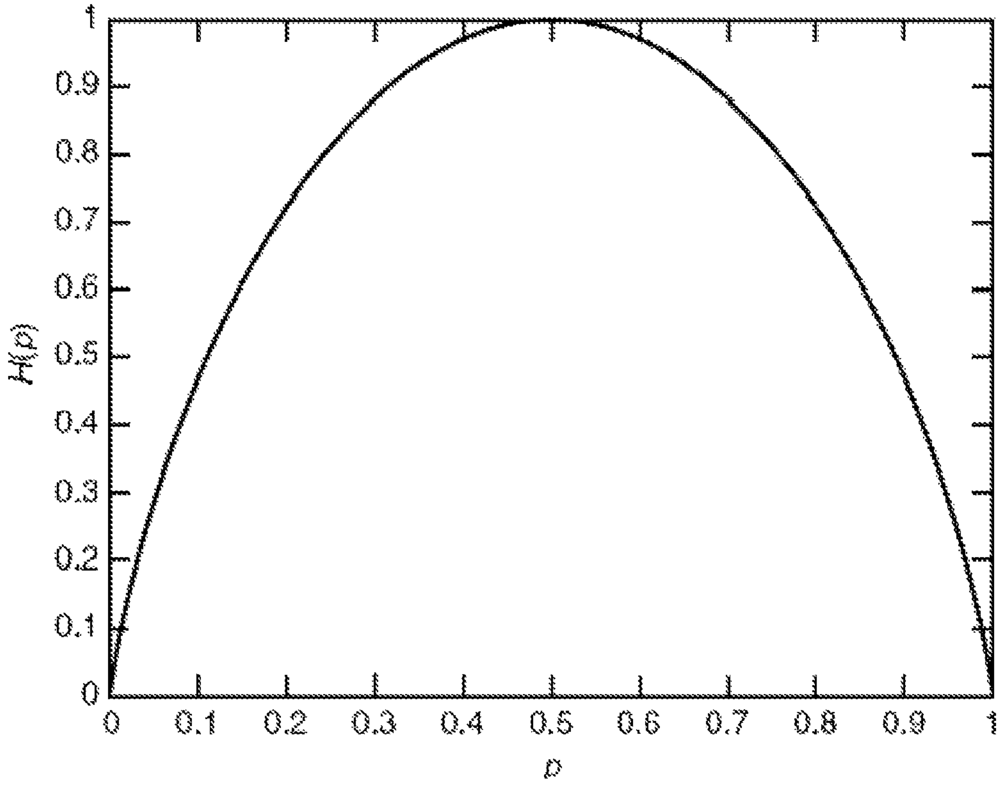
FIG. 1 graphically depicts uncertainty H(p) as a function of p.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art and are to be construed as being without limitation to such specifically recited examples and conditions. Additionally, the term "or" as used herein refers to a non-exclusive or, unless otherwise indicated (e.g., "or else" or "or in the alternative"). Also, the various embodiments described herein are not necessarily mutually exclusive, as some embodiments may be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments.

Various embodiments provide systems, methods, architectures, mechanisms, and apparatus for optimizing testing pertaining to a circuit under test (CUT) such as by (i) correcting flip-flop and latch initialization problems, (ii) determining which test point sites contribute most to fault loss during testing, and (iii) finding the nearly optimal sites for test points using Entropy, Entropy Gain, and/or Entropy Derivative measures. The embodiments strive for a nearly optimal solution in that the test points use the smallest amount of test-related hardware possible and boost the circuit fault coverage the most. All passes over the circuit employ the novel tournament structure of this invention where test points compete and are ranked by importance. For some circuits, it is also effective to combine these three main device metrics with the level number of logic gates (their depth in the circuit). Various embodiments use some or all of four methods for inserting DFT hardware, in any arbitrary order, as well as additional methods based on device spectral analysis.

U.S. Pat. No. 8,164,345, Spectral and Information Theoretic Method of Test Point, Partial-Scan, and Full-Scan Flip-Flop Insertion to Improve Integrated Circuit Testability), is incorporated herein by reference in its entirety and included in this document.

The present invention relates to testing integrated circuits, either before or after they are inserted into chip packages. In particular, this application provides a method and algorithm for locating circuit devices that are generating X (unknown) or Z (high impedance) state signals, and to automatically insert the necessary hardware test structures (e.g., monitoring points, sequential or combinational logic circuitry, and so on) into any digital integrated circuit, in order to eliminate this problem and drastically reduce the cost of testing. This application also provides a mechanism for making test point selection more effective, using estimates of the untestable faults caused by uncontrollable or unobservable devices in the chip.

This invention and patent were motivated in part by an observation that the test point insertion method of U.S. Pat. No. 8,164,345 was highly effective on microprocessor circuits, but only modestly effective on wireless cell phone circuits. After additional research, this problem was traced to the presence of large numbers of latches in telecommunications circuits. Industry practice in some non-telecommunications companies is to completely avoid using latches. This additional research uncovered new methods to improve test-point selection in telecommunications circuits.

Figure 2:
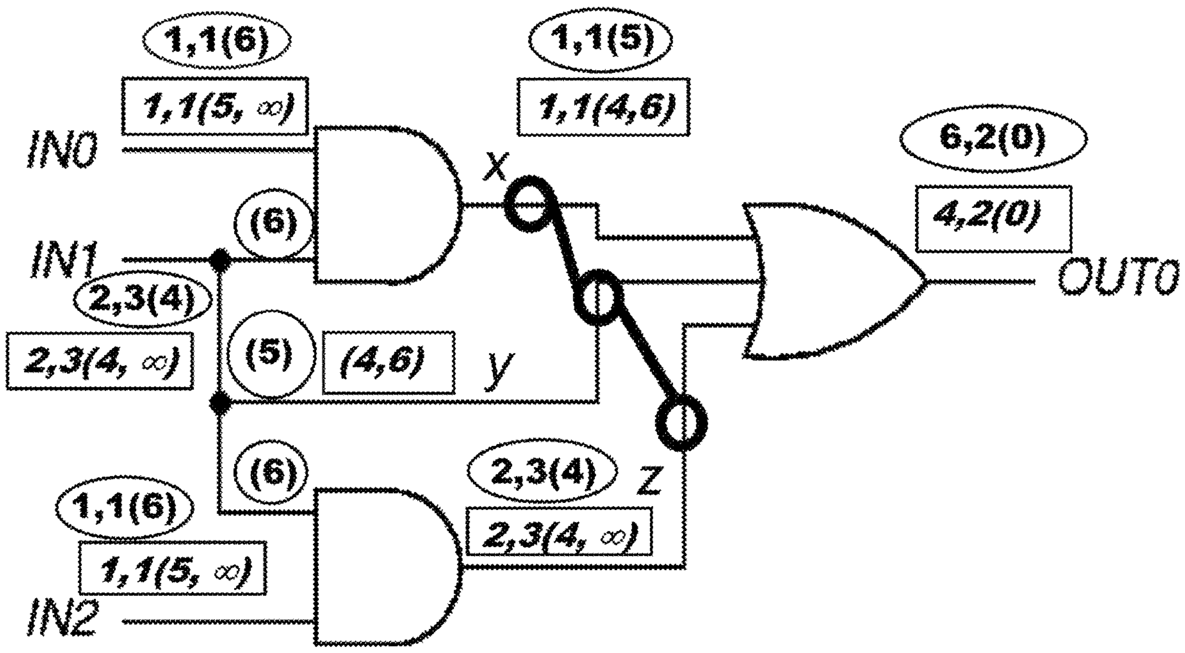
FIG. 2 PRIOR ART
FIG. 2 illustrates an example of erroneous SCOAP Testability of a logic circuit.
Figure 3:
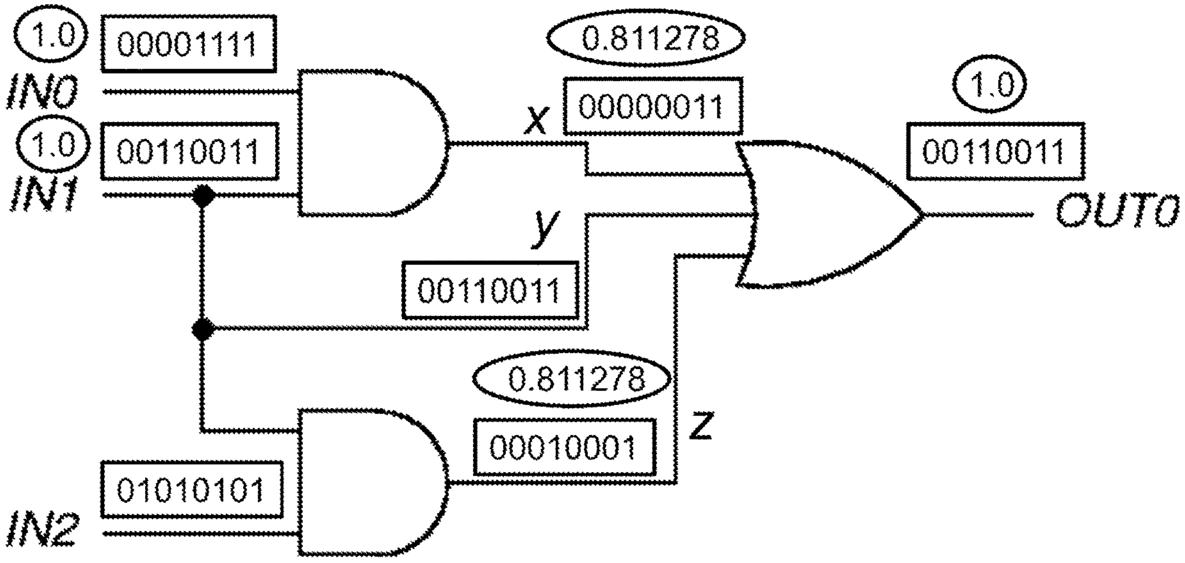
FIG. 3 illustrates an example of accurate entropy measures for the logic circuit of FIG. 2.

FIG. 3 illustrates an example of accurate entropy measures for the logic circuit of FIG. 2. Specifically, FIG. 3 depicts the corresponding entropy measures from a tool created by the inventor and denoted herein as the Entropy™ tool.

In various embodiments, the Entropy™ tool provides a data analytics tool applied to analyzing testability problems in ULSI (ultra large scale integrated circuits) capable of performing a number of useful functions, including some or all of: (1) Locate untestable devices in circuits; (2) Explain why the devices are untestable; (3) Predict untestable device locations in circuits (root cause analysis); (4) Determine competitively which devices need test points, and in what order they should be corrected; and/or Backtrace from X/Z signals in scan chains, to find the root cause of untestability.

The Entropy™ tool or other embodiments optionally produces a fault loss report that (1) Lists proposed test point sites, from highest to lowest fault loss; (2) Gives order for inserting test points in an actual device or representation thereof; (3) Projects approximate # of faults lost; and/or (4) Accounts for scan chains, which can greatly magnify fault loss when an X/Z is clocked into them.

As used herein, the term "test point" may refer to a location for inserting testing related structure and the term "insert test point(s)" may refer to the specific circuitry inserted thereat such as monitoring circuitry, sequential logic circuitry, combinational logic circuitry, and/or some other passive or active testing-related structure useful in monitoring or testing circuitry such as within an integrated circuit (IC) or other system or circuitry under test so as to derive testing/performance information therefrom.

The Entropy™ tool or other embodiments provides uses various analytical measures and testability modes, such as

- Entropy—the information content of a circuit signal
- Entropy Gain—the improvement in a signal's information content were a test point to be inserted on the signal, based on the structure and types of its fanouts
- Entropy Derivative—the difference between the entropy of a device and the entropy of its fanout with the highest entropy
- Level—the Depth of the signal in a circuit
- PercentX/Z—the percentage of the time a signal is in the X/Z state
- Fault Loss—the number of stuck-at faults that cannot be tested due to a signal
- Spectrum—the signal's digital frequencies measured over 32 or 64 clock periods The Entropy™ tool or other embodiments provides various features such as Latch testability optimization (for mproc and telecom circuits), as well as new testability optimization modes validated with results for Entropy Gain, Entropy Derivative, Percent X/Z values on a signal, Estimated Fault Loss (most beneficial for scan chain problems), Logic Level and Entropy optimization, Spectral Analysis, and so on.

In FIG. 2, the SCOAP testability measures give the erroneous impression that controlling or observing signals x, y, and z are independent events. Let CC0 (x) (CC1 (x)) denote the combinational controllability to 0 (1) effort for signal x. Let CO (x) denote the effort to observe x (either a 0 or a 1). In FIG. 3, the following is shown:

CC0 (x), CC0 (y), CC0 (z) correlate

CC1 (x), CC1 (y), CC1 (z) correlate

CO (x), CO (y), CO (z) correlate

These numbers are CC0, CC1 (CO0, CO1) and are the corrected SCOAP measures in FIG. 2 shown in black boxes in italics. The original SCOAP controll abilities are shown in ellipses in ordinary text and are CC0, CC1 (CO). The ordinary parenthesized text in circles gives the observabilities of fanout stem branches, since they often differ from the stem observabilities. The SCOAP measures give the incorrect impression that signals IN0, IN2, x, and z are fully observable, when, in fact, only logic 0 can be observed from these signals (it is impossible to observe logic 1). Also, the SCOAP measures overstate the difficulty of controlling OUT0 to logic 0. In FIG. 2 italicized measures in boxes show corrected SCOAP values that account for correlation. Also, the observation effort has been broken down into two numbers, the first being the effort to observe a logic 0, and the second being the effort to observe a logic 1. So, even in this small circuit, SCOAP measures lead to erroneous conclusions about testability. While these errors matter little in small circuits, they become devastating during test generation for large circuits. The errors result from signal fanout and reconvergence.

The exhaustive circuit simulation in FIG. 3 is identified by signal: the signal values over 8 clock periods are boxed, and entropies are circled. Also, all 3 inputs have an entropy of 1.0, as does the output, OUT0. These measures are absolutely accurate, since they are derived from logic simulation, and therefore incorporate signal correlation. They allow the test point inserter to avoid improper insertion of testability hardware in the wrong places. In particular, note that the entropy derivatives from signals IN0 to x and IN2 to z are 0.1887 (the entropy decreased). These are precisely the places where the more accurate SCOAP measures in FIG. 2 indicate an inaccuracy problem with SCOAP observability measures. The Entropy™ tool or other embodiments uses entropy and its derivative to estimate difficulties more accurately in controlling and observing signals. Its placement of test points is quite superior to the placement from algorithms that use SCOAP testability.

These problems of incorrect testability measures are greatly magnified in large circuits and can be addressed most effectively by the various embodiments. Since the Entropy™ tool or other embodiments use logic simulation to calculate probabilities and entropies, signal correlation (as indicated by the signals x, y, and z in FIG. 2) is correctly handled, and the probabilities will be correct. Of course, the fundamental reason for these problems is the redundant logic in the circuit, which can be simplified to the logic function: OUT0=IN1. The conventional testing approach of removing all such redundancies no longer is followed by industry, where it is commonplace to tie off logic inputs to a 0 or a 1, which causes much redundancy in the circuit. Also, many low-volume industrial designs still have redundant hardware in them because there is not sufficient design time allowed for the Engineers to remove it.

Some embodiments of the invention extend U.S. Pat. No. 8,164,345 to: (1) allow the Entropy™ tool or other embodiments to estimate and locate lost faults and identify the most promising sites for test points in circuits, (2) allow the Entropy™ tool or other embodiments to identify X/Z generators in circuits, and (3) to reduce Test Volume (TV), Test Application Time (TAT), and Test Cost. The full benefit occurs when the user does both stuck-at and transition delay fault testing. The Entropy™ tool or other embodiments obtain a 64% reduction in TAT and a 64% reduction in TV with test data compression. Test data compression is performed by using software to compress the resulting test patterns into a far shorter set. The patterns are applied to the chip-under test by an instrument, and on-chip hardware decompresses the patterns to restore them to their original length and width. Circuit responses to the test patters are then compressed by on-chip hardware and sent back to the test instrument.

Presented herein are new design for testability (DFT) algorithms, apparatus, mechanisms, tools, and systems to rapidly estimate the number of faults made untestable by a given circuit signal being either in the X/Z logic state, uncontrollable, or unobservable.

At present, chip hardware is increasing beyond 2 billion devices on a single chip. There are at least two more shrinks of the transistor that are possible with the FINFET technology realized by several companies. After that, three-dimensional integration of chiplets, which are modest-sized chips, by stacking them vertically will ensure that device scaling proceeds according to Moore's Law, but in the third dimension. The demand for increased circuit integration and functionality appears to be endless.

However, these technological advances cause severe and expensive circuit testing problems. Historically, roughly a third of the electronic system cost is due to making chips, a second third is due to packaging the chips, and the final third is due to testing the chips and the system in which they are embedded. While chip making costs and their packaging costs scale down consistently as devices shrink, the volume of the chip testing data actually scales up as transistor feature sizes shrink and more devices are placed on a single chip. Furthermore, our ability to probe chips and measure their electrical behavior decreases dramatically as the feature sizes and pins on the devices scale down. The result of this is steadily increasing circuit testing costs as devices scale down.

A benefit of the current invention is to provide a system whereby the volume of testing experiments and test data for a system can be significantly reduced, with the benefits of drastically reduced test costs for microprocessor and telecommunications circuits. Logic simulation of the circuit with random digital input noise accurately estimates signal probabilities and Entropy. Some embodiments expand the methods of U.S. Pat. No. 8,164,345 to consider latches of all types in telecommunications circuits. U.S. Pat. No. 8,164,34 only considers digital logic gates and flip-flops. In addition to the methods of that patent, this new method estimates the number of faults made untestable by X/Z values at every X/Z generator in the circuit. We also estimate the number of faults made untestable by uncontrollable/unobservable devices. We use these untestable fault estimates in a cost function. We automatically generate a report listing the X/Z generators. Finally, we automatically insert test points into the circuit based on the untestable fault counts, X/Z values, and Entropy cost functions.

System in a package (SIP) designs and system-on-a-chip (SOC) designs sacrifice easy observability and controllability of on-chip signals, in order to realize the economic benefits of increasing hardware integration, i.e., more devices on a single chip or in a single package. As a result, non-functional hardware (called DFT hardware) must be inserted into these designs to make it possible to test every transistor and wire throughout the design.

1. Test Points, Blockers, and Scan Flip-Flops

Figure 4:
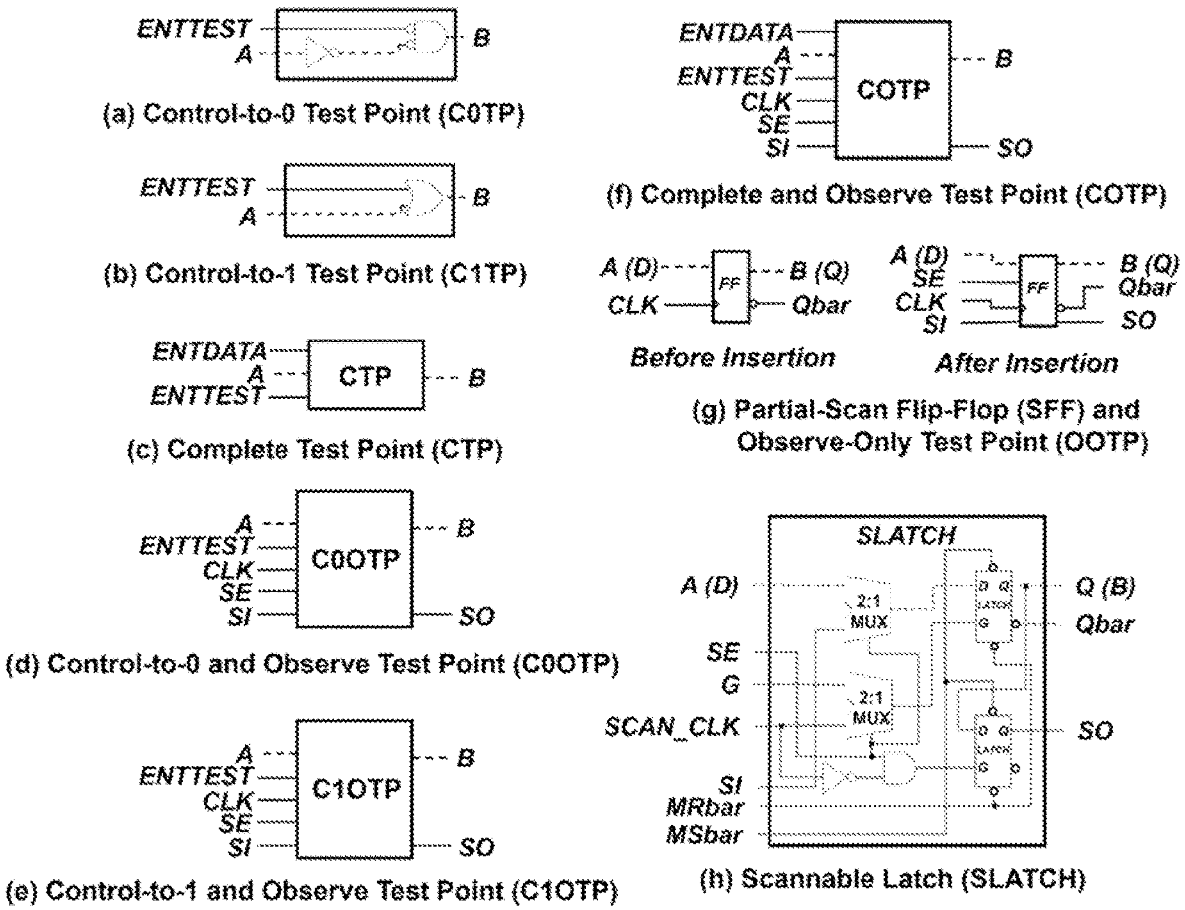
FIG. 4 schematically illustrates several combinational and sequential logic test point configurations useful in understanding the various embodiments.
Figure 5:
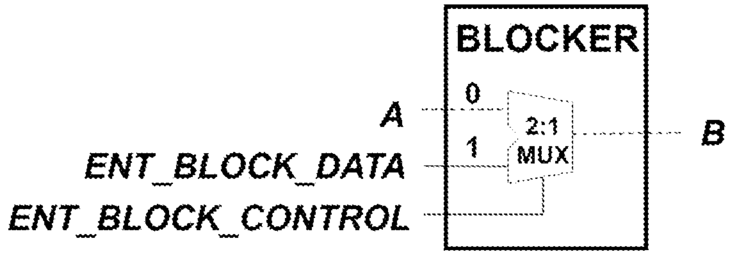
FIG. 5 schematically illustrates a blocking test point.

FIG. 4 schematically illustrates several combinational and sequential logic test point configurations useful in understanding the various embodiments. FIG. 5 schematically illustrates a blocking test point. FIGS. 4-5 depict typical hardware such as for signal control points (FIGS. 4(*a*)-4(*b*)), signal control-to-0 or 1 test points (FIG. 4(*c*)), signal control-to-0 and observation points (FIG. 4(*d*)), signal control-to-1 and observe test points (FIG. 4(*e*)), signal control-to-0 or 1 and observe test points (FIG. 4(*f*)), a partial-scan flip-flop (FIG. 4(*g*)), a partial-scan latch (FIG. 4(*h*), and an X/Z blocker test point (FIG. 5). In all these figures, the dotted line(s) from signal A to B indicate the original path in the circuit that needs testability enhancement.

Various embodiments of the invention automatically determine where these hardware devices should be inserted in an integrated circuit to make it testable. The control to 0/1 test points (FIG. 4(*g*)-(*h*)) are activated when signal ENTTEST is asserted to 1. New test points use a global input, ENTDATA, to allow control of whether the control test points set a signal to logic 0 or logic 1. The observe-only test point, scan flip-flop, and scannable latch sample data on the rising edge of CLK. When SE is asserted to 1, and these devices are clocked, they will shift their contents from SI to SO. Finally, the X/Z BLOCKER test point will replace the signal at B with the ENT_BLOCK_DATA signal when the ENT_BLOCK_CONTROL signal is asserted to 1.

2. Estimation of Signal Probabilities

The method proposed in this invention to determine untestable faults is based on signal probabilities of a given signal (in a 4-valued Boolean algebra) being in the logic 0, logic 1, unknown (X), or high impedance (Z) state. The following methods (and others) appear in the prior art to estimate signal probabilities:

1. Logic simulating the circuit, with random (white) input digital noise. Counts of 0/1/X/Z states are accumulated for every device in the circuit.
2. Using the Parker-McCluskey equations to mathematically compute signal probabilities throughout the circuit during a depth-first traversal from the inputs to the outputs.

These and any other methods may be used with this invention to estimate the signal probabilities. The DFT insertion tool (e.g., the Entropy™ tool or other embodiments) uses Method 1 or Method 2, depending on the option given.

3. Contributions and Advantages of the Inventive Embodiments

A first contribution of the disclosed embodiments is the extension of the methods of U.S. Pat. No. 8,164,345 by performing logic simulation and optimization of test points in latches in the circuit. That patent only considered logic gates and flip-flops.

A second contribution of the disclosed embodiments is an algorithm to locate X/Z generator sites in the circuit. The third contribution is an algorithm to estimate counts of untestable faults due to the X/Z generators. The fourth contribution is an algorithm to estimate counts of untestable faults due to uncontrollable/unobservable signals. The fifth is a method to optimize the DFT hardware insertion by using the estimate of the number of untestable faults due to X/Z generators as an optimization cost function. The sixth is a method to optimize the DFT hardware insertion by using the estimate of the number of untestable faults due to uncontrollable/unobservable signals as an optimization cost function.

Another contribution of the disclosed embodiments is defining new testability measures, Entropy Gain and Entropy Derivative, that provide more accurate means of siting test points than using the Entropy measure alone.

Other contributions of the disclosed embodiments are readily discernable to those skilled in the art and informed by the teachings within this document.

4. Locating X/Z Generators

It is customary to equip most flip-flops in circuits with scan chain hardware, shown in FIG. 4(*e*). In functional mode, the SE signal is set to 0, and the flip-flop loads from the D input when it is clocked and presents the output later at the Q output. In scan mode, the SE signal is set to 1, and the flip-flop instead loads from the SI input when it is clocked and presents the output later at the SO output. This is implemented with a 2-1 MUX on the D line of the flip-flop. This method provides a way to make all memory contents within the circuit visible to the outside world. The scan flip-flops are stitched together into shift registers, with SO of the prior flip-flop in the register driving the SI input of the next. All flip-flops in a scan register must have the same clock domain and be controlled by the same SE signal. Some designs even apply this scan test hardware concept to latches.

It is customary, because of the severe reduction in testing costs by 50 or more, to use test data compression. In the simplest test data compression, a compression algorithm is applied to the test data and the compressed version of the data is loaded into the automatic test equipment (ATE). Not only is the volume of the data greatly reduced, but the number of bits in a test vector is reduced from thousands to several dozen. During a chip testing epoch, the ATE (automatic test equipment) applies the compressed data to a subset of the chip input pads. An on-chip hardware decompressor applies the inverse of the compression algorithm to this incoming data to decompress the data so that it can be used internally in the chip for test purposes.

In order to reduce the volume of output test response data going from the chip back to the ATE, an XORing network is added to the outputs of the scan chains. All test responses must be observed through these scan chains. The XORing network reduces the number of scan chain outputs that must be observed from the chip from several thousand to several dozen. Unfortunately, if any unknown signal state (X or Z) in the chip is clocked into a scan chain, it corrupts the bits in the chain to the right of it in the scan register. It also corrupts all of the information in the XORing compression network. While so-called X-tolerant compressors exist, they are not particularly effective.

X/Z signal values can be generated within a chip due to any of these sources:

A delay fault in the logic.
An undriven primary input or primary I/O.
An undriven or incorrect clock.
An uninitializable latch or flip-flop.
A latch in the opaque mode.
Feedback in the circuit.
A memory.
A black/empty box, which is used to model missing circuit hardware.
A malfunctioning clock gater (gate circuit).
Misconfigured test hardware.
A tri-state bus that is not driven.
Logic gates with no connected inputs.
Primary inputs that are clamped in the X or Z state.

Unfortunately, at present the very large circuits have tens of thousands of these situations. It is not economically feasible, nor necessary, to eliminate all these X/Z generators. However, it is extremely difficult and time-consuming to manually determine which ones are important and need to be eliminated. It frequently can take a DFT test engineer with a doctorate three months or more to find the important X/Z generators and correct them. The present invention provides a method to locate these X/Z generators automatically, during several days of computing, and to automatically insert the DFT hardware to eliminate the X/Z generators in the circuit.

5. Untestable Fault Count Estimation

5.1 Estimation of Untestable Faults Due to X/Z Generators (or Uncontrollable Signals)

We now provide an approximation algorithm to estimate the untestable fault count caused by each X/Z generator. For this approximation, we trace forwards from the X/Z generator to all primary outputs to count the number of untestable faults caused by the X/Z generator. The algorithm counts untestable faults as it traces. It traces through each encountered device from an input to one or more outputs, setting a flag so that each device is traced only once to avoid over-counting untestable faults.

Figure 6:
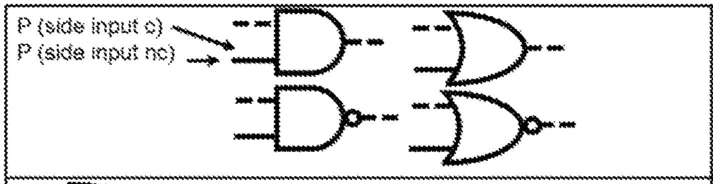
FIG. 6 illustrates examples of less complex types of hardware devices to be considered for estimation, and their Untestable Faults, in accordance with various embodiments.
Figure 6:
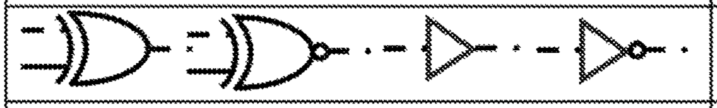
Figure 6:
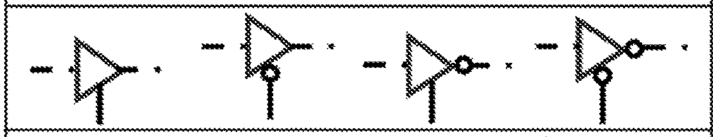
Figure 6:
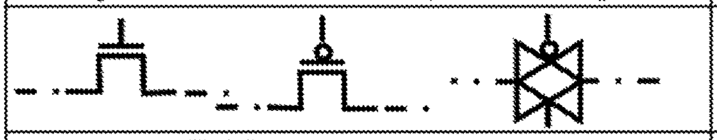
Figure 6:
Figure 6:
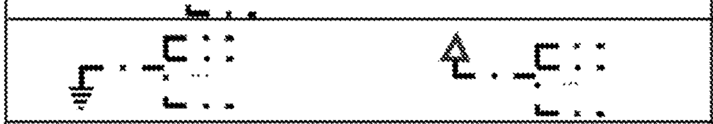
Figure 6:
Figure 7:
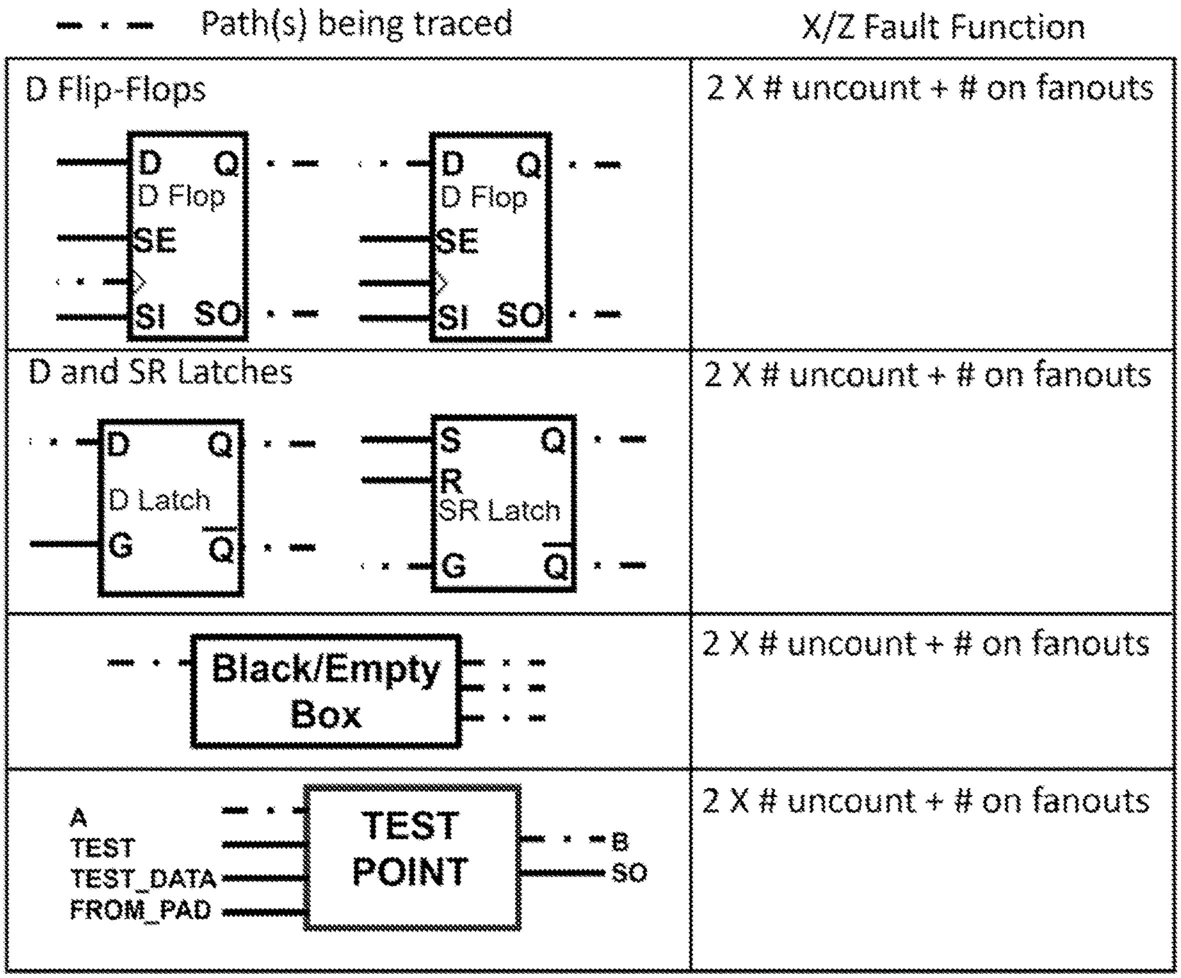
FIG. 7 illustrates examples of more complex types of hardware devices to be considered for estimation, and their Untestable Faults, in accordance with various embodiments.

FIG. 6 illustrates examples of less complex or smaller types of hardware devices to be considered for estimation, and their Untestable Faults, in accordance with various embodiments, whereas FIG. 7 illustrates examples of more complex or larger types of hardware devices to be considered for estimation, and their Untestable Faults, in accordance with various embodiments. The side inputs of a device are the inputs NOT on the path being traced (only 1 input is on the traced path). Table 1 gives the expressions for P (side input nc), the probability that a particular side input of a device is in the non-controlling state.

The following additional variables are defined:

#uncount=number of as yet uncounted inputs to the device

| Algorithm 1: Location of X/Z Generators |
|---|
| 1. Using any of the above methods, logic simulate the circuit and record counts of Logic 0, Logic 1, X, and Z at every device using a 4-valued logic simulator to initialize or "warm up" the circuit. |
| 2. Conduct a series of Tournaments to locate the n worst X/Z generators. The tournaments end when a pre-specified number of test points have been inserted, or when the various testability measures of the entire circuit rise above pre-specified thresholds or distributions. Each Tournament proceeds as follows: |
| A. Using any of the above methods, estimate the probabilities of Logic 0 and Logic 1 (and not including X/Z states) at every device output. |
| B. Examine every flip-flop in the scan chains in the circuit with X/Z on its Q or $\overline{Q}$ outputs more than 1% of the time (or any other xzthreshold percentage): |
| i. If the X/Z signals are entering the flip-flop from the SI and/or SE inputs, do nothing to that flip-flop. |
| ii. If the X/Z signals are coming from the other inputs, insert an X-blocker. The actual site of the X-blocker is determined by a depth-first search back-trace from the D, MSbar, MRbar, and CLK inputs through the driving logic, following the backwards path of highest X/Z frequency to the device with the highest X/Z frequency. If this is another scan flip-flop, with X/Z signals coming in from inputs other than SI or SE, or an ordinary flip-flop, continue the back trace through its inputs. If the scan chain itself is the X/Z generator, terminate the back trace at that flip-flop. (Eventually this option will correct the X/Z problem, by finding the earliest point in the entire scan chain where X/Z signals are entering.) Return dft_site, the device with the highest fraction of X/Z values during the back trace. |
| a. If a combinational/sequential feedback point is encountered during the back trace, the back trace terminates and the feedback point is returned as dft_site. |
| b. Mark the fanout cone of dft_site to prevent any DFT hardware insertion in its fanout during this tournament (but not in later ones). |

Algorithm 1 will find the X/Z generator that causes each bit of the scan chain to become loaded with an X/Z. This saved list of up to n dft_sites is called blocker_candidates. Since many X/Z generators often affect multiple scan chain bits, this method is much less wasteful of DFT hardware than putting an X/Z blocker on every D input to every scan flip-flop. At this point, the list can be printed for the DFT engineer, who can manually select sites for inserting blockers.

#on fanouts=number of untestable faults on all device fanouts
(including fanout stem faults)

#controls=number of control lines on this memory port (1 to 3)

#on fanins=number of untestable faults on uncounted device inputs

P (side input c) is the probability that a particular side input of a device is in the controlling state. P (side input nc) is the probability that the values of all side inputs of a device leave it in the non-controlling state. The X/Z state will enter the device on one or more of its inputs, and this algorithm computes P (side input nc), the probability that the side inputs (the ones not being traced forward for X/Z states) will collectively be in a non-controlling logic state (this will be logic 0 or 1, depending on the device). This is simply the product of all probabilities of side inputs being in the non-controlling state.

$$P(\text{side input } nc) = \prod_{i \le side\ inputs\ not\ being\ traced}^{i=1} P_i(\text{side input } nc)$$

$$P(\text{side input } c) = 1.0 - P(\text{side input } nc)$$

This method is implemented as a recursive function doing a depth-first forward netlist traversal. For devices where an off-path input (an input not on the path being traced forward) can control the device output independently of all other inputs, we compute the expectation of the number of untestable faults caused by the device. If off-path inputs control the device, this will be the number of untestable faults on the inputs (counting the path being traced) multiplied by the probability of the off-path inputs controlling the device (P (side input c)). If off-path inputs do not control the device, this is the sum of all untestable input faults of the device multiplied by the probability of the off-path inputs not controlling the device (P (side input nc)). To this number of untestable faults is added the number of untestable faults on the fanouts (computed recursively). For all other devices without the possibility of off-path inputs controlling their output, independently of the other inputs, we just add the number of untestable faults on the fanouts to the number of untestable faults for the device, since an X/Z state on the input being traced makes all faults on the device untestable. This implicitly accounts for both fanout stem and branch faults.

Table 1 depicts, for various hardware types, Hardware Device P (side input nc/c) due to an X/Z Value on the Device. Table 1 is the computation of P (side input nc) and P (side input c). N/A for a device means that its output is always X/Z, because an input forward propagates an X/Z.

TABLE 1

| Hardware Type | P (side input nc) | P (side input c) |
|---|---|---|
| AND/NAND/Wired AND | (1.0 − P (0)) | P (0) |
| OR/NOR/Wired OR | (1.0 − P (1)) | P (1) |
| bufif0/notif0 | (1.0 − P (side input c)) | P0 (SEL) |
| bufif1/notif1/Trans. Gate | (1.0 − P (side input c)) | P1 (SEL) |
| n FET | (1.0 − P (side input c)) | P1 (GATE) |
| p FET | (1.0 − P (side input c)) | P0 (GATE) |
| All Other Devices | N/A | N/A |

Table 2 depicts, for various hardware types, X/Z Fault Function Values for Hardware Devices. Table 2 shows the computation of the untestable X/Z Fault Function Value (the number of untestable faults caused by an X/Z on the device output) for all commonly used hardware devices. The untestable fault counting algorithms mark each device in the circuit as 'visited' when they process it, so that it will not be counted again. The variable # uncount takes this into account. The # on fanouts variable handles all device fanouts on Q, Qbar, and SO. In addition, it will be incremented by 2 to account for fanout stem faults, when there are branches.

TABLE 2

| Hardware Type | Fault Function Value (flts) |
|---|---|
| Buffer/Inverter | flts = (2 × # uncount) + # on fanouts |
| AND/NAND/ Wired AND/OR/ NOR/Wired OR | flts = P (side input nc) × (2 × # uncount) + P(side input c) × (2 × ((# uncount − 1) + 1) + # on fanouts |
| XOR/XNOR | flts = 2 × # uncount + # on fanouts |
| bufif0/notif0/ bufif1/notif1 | flts = P(side input c) × (2 × ((# uncount − 1) + 1) + P(side input nc) × (2 × # uncount) + # on fanouts |
| Trans. Gate | flts = P(side input c) × (2 × ((# uncount − 1) + 1) + P(side input nc) × (2 × # uncount) + # on fanouts |
| n FET/p FET | flts = P(side input c) × (2 × ((# uncount − 1) + 1) + P (side input nc) × (2 × # uncount) + # on fanouts (drain) |
| Primary Input/I/O | flts = 2 + # on fanouts |
| Primary Output | flts = 2 |
| Tied 0/1 | flts = 1 + # on fanouts |
| Tied X/Z | flts = 2 + # on fanouts |
| D/Scan D flip-flop | If Q fanouts, add = 2; if Qbar fanouts, add = add + 2; If SO fanouts, add = add + 2; flts = add + 2 × # uncount + # on fanouts |
| D and SR latch (clocked or not) | If Q fanouts, add = 2; if Qbar fanouts, add = add + 2; flts = add + 2 × # uncount + # on fanouts |
| Black/Empty Box | flts = 2 × # uncount + # on fanouts |
| Memory | Sum over all ports: flts = 2 × # uncount + # on fanouts |
| Test Point | If Q fanouts, add = 2; If SO fanouts, add = add + 2; flts = (2 × (# uncount)) + add + # on fanouts |

Algorithm 2: Estimation of Number of Untestable Faults for an X/Z Generator

1. Run Algorithm 1 to create the list blocker_candidates
2. for (j = 0; j < list length (blocker_candidates); ++ j )
   A. dft_site = blocker_candidates [j] ;
   B. For each fanout of site (can be an output or input/output)
      i. Forward trace fanout in depth-first fashion
         a. Apply Algorithm 2 to fanout
         b. Record untest[i], the number of untestable faults on the ith fanout when dft_site is X/Z
   C. untestable_faults [j] = X/Z Fault Function Value ($dft_{site}$) + $\Sigma_i$ untest[i]
      untestable_faults [j] = untestable_faults [j] + 2 if this is a fanout stem.

Table 3 depicts, for various hardware types, Unobservable Fault Function Values for Hardware Devices.

TABLE 3

| Hardware Type | Fault Function Value |
|---|---|
| Buffer/Inverter | 2 + # on fanins |
| AND/NAND/Wired AND/OR/ NOR/Wired OR/Test Point | 2 + # on fanins |

TABLE 3-continued

| Hardware Type | Fault Function Value |
|---|---|
| XOR/XNOR | 2 + # on fanins |
| bufif0/notif0/bufif1/notif1/ Trans. Gate/nFET/pFET | 2 + # on fanins |
| D/Scan D flip-flop | If (more than one Q/Qbar/SO fanouts) 2 Else 2 + # on fanins |
| D and SR latch (clocked/ unclocked) | If (more than one Q/Qbar fanouts) 2 Else 2 + # on fanins |
| Black/Empty Box | 2 + # on fanins |
| Memory | If (>one fanout) 4 Else 2 + # on fanins |
| Primary Input/I/O | 2 |
| Primary Output | 2 + # on fanins |
| Tied 0/1 | 1 |
| Tied X/Z | 2 |

5.2 Estimation of Untestable Faults Due to Uncontrollable/Unobservable Signals Devices in the circuit that are not generating X/Z states can still have testability problems. The entropy measures of the device indicate whether it is uncontrollable or unobservable. If the device is uncontrollable, this is essentially equivalent to it having a significant number of X/Z values, so Algorithm 2 (above) is used to estimate the number of untestable faults in this situation. If, instead, the device is unobservable, then we propose Algorithm 3 below to estimate the number of untestable faults resulting from this situation. Algorithm 3 back traces from dft_site through the circuit, tallying the untestable faults, until it finds signals that have other observation paths, at which point the recursion terminates. Table 3 shows the unobservable fault function value for the various hardware devices. The interpretation in Table 3 for memories is very conservative and assumes that if the entire input or output data bus of a memory is unobservable, then the entire memory is unobservable.

```
Algorithm 3 (dft_site) // Back trace from an unobservable fault site (dft_site)

1.  Run Algorithm 1 to create the list test_point_candidates
2.  For each dft_site in test_point_candidates
      A.  flts = Unobservable Fault Function Value (dft_site) // From Table 3
      B.  For each fanin (input) to dft_site
          i.      if (# fanouts (fanin) == 1)
                      flts = flts + Algorithm 3 (fanin)
                  else
                      flts = flts + 2
3.  Return (flts)
```

Algorithm 3 only back traces logic device inputs with exactly 1 fanout, because ones with more than one fanout are presumed to be observable. However, it still tallies 2 branch faults for the fanins that have more than one fanout.

6. Algorithms to Automatically Insert Testability Hardware to Improve Testability

6.1 Automatic X/Z Blocker Insertion

The basis for this patent is the observation that the untestable fault function can be very effectively used as a cost function for an optimizer, as discussed in U.S. Pat. No. 8,164,345. Minor errors in the untestable fault estimates do not matter, for test point selection, as long as the errors roughly inflate or deflate the estimates for all circuit nodes fairly uniformly.

Various embodiments contemplate experiments with the industrial software implementing test point selection, such as discussed in U.S. Pat. No. 8,164,345. In that method, the optimizer stimulated the circuit with random input digital noise and initialized it. Then, it conducted a series of tournaments. During each of these, it selected a set of test point sites based on how many levels of logic there were from the Primary Inputs of the circuit, and within that, sorted by descending order Entropy measures computed from the 0/1/X/Z counts for each device produced by the logic simulator.

Various embodiments herein contemplate an optimizer modified such that when scan flip-flops were in the X/Z state more than 1% of the time, the optimizer back traced from the inputs of the scan flip-flop and found the actual X/Z generation device (Algorithm 1). Then, it estimated the number of untestable faults caused by the generator using Algorithm 2. Finally, the cost function was changed to use descending order X/Z fractions for devices needing blockers, and within that descending order it used counts of untestable faults caused by each X/Z generator. Only after all X/Z generators were handled, would the algorithm examine other test point opportunities and rank them using the number of levels of logic from PIs, and within that by ascending order Entropy measures. Algorithm 4 describes this optimization.

```
Algorithm 4 (n, t) // n is the desired # of blockers,
t is # to insert in each tournament

1.  Run Algorithm 2 to create the list blocker_candidates and its corresponding lists
    X/Z_fractions and untestable_faults
2.  Sort the three lists by untestable_faults counts within X/Z_fractions, both in
    descending sequence
```

-continued

| Algorithm 4 (n, t) // n is the desired # of blockers, t is # to insert in each tournament |
|---|
| 3. Run tournaments to select n X/Z blockers - For each tournament<br>A. Attempt insertion of the first t blockers, in order, from the lists<br>B. Each blocker has its fanin cone and fanout cone flagged so that additional blockers cannot be inserted in those cones.<br>C. Consider additional blockers in the lists, if fewer than t were able to be inserted<br>D. Continue tournaments until n blockers are selected, no sites are available for blocker insertion, or the Entropy distribution of the circuit no longer improves. |

6.2 Automatic Test Point Insertion

The automatic X/Z blocker insertion discussed herein works well. Further experiments were conducted in a manner similar to the test point selection disclosed in U.S. Pat. No. 8,164,345. In that method, the optimizer stimulated the circuit with random input digital noise and initialized it. Then, it conducted a series of tournaments. During each of these, it selected a set of test point sites based on how many levels of logic they were from the Primary Inputs of the circuit, and within that, sorted by descending order Entropy measures computed from the 0/1/X/Z counts for each device produced by the logic simulator. We modified the optimizer so that when scan flip-flops were in the X/Z state more than 1% of the time, it back traced from the inputs of the scan flip-flop (Algorithm 1) and found the actual X/Z generation device. Then, it estimated the number of untestable faults caused by the generator using Algorithm 2. Finally, the cost function was changed to use descending order X/Z Fractions for devices needing blockers, and within that, descending order counts of untestable faults caused by each X/Z generator. Only after all X/Z generators were handled, would the algorithm examine other test point opportunities and rank them using ascending order Entropy measures, and within that by the number of untestable faults due to every low Entropy point (as computed by Algorithm 4).

In Algorithm 5 (below), n is desired # of blockers/test points and t is the # of test points to insert in each tournament.

| Algorithm 5 (n, t) |
|---|
| 1. Run Algorithm 2 to create the list test__point__candidates and its corresponding lists X/Z__fractions and untestable__faults<br>2. Run Algorithm 3 to select uncontrollable/unobservable test points to add to the end of the list blocker__candidates and its corresponding lists X/Z__fractions, untestable faults, and entropy values<br>3. Sort the blocker portions (the beginning) of the three lists by untestable__faults counts within X/Z__fractions, both in descending sequence<br>4. Sort the uncontrollable/unobservable test point portions (the tails) of the three lists by untestable__faults counts (descending order) within X/Z__fractions (in ascending order)<br>5. Run tournaments to select n X/Z blockers and/or test points - For each tournament<br>A. Attempt insertion of the first t items, in order, from the lists<br>B. Each blocker or test point has its fanin cone and fanout cone flagged so that additional blockers/test points cannot be inserted in those cones.<br>C. Consider additional elements in the lists, if fewer than t were able to be inserted<br>D. Continue tournaments until n blockers/test points are selected, no sites are available for blocker insertion, or the Entropy distribution no longer improves. |

7. Lost Fault Estimation Theory

This patent uses a new theory to estimate how many faults are undetectable (or lost) due to a fault at a particular site in a circuit. The -blkflt and -tpflt options of the Entropy™ tool or other embodiments use a new cost function, based on an estimate of the number of faults that each X/Z generator/untestable node in the circuit causes to be untestable (lost). In -blkflt mode, Entropy™ tool uses the -bltp option, which notices which scan D flip-flops have X/Z values on Q more than 0.01% of the time. The Entropy™ tool or other embodiments backtraces from the inputs to such flops at the end of the tournament (an input may be D, Clock, MSbar, or MRbar), following the path with the highest frequency of X/Z values. Once it reaches the node on that path with highest X/Z frequency, that X/Z generator is put in the candidate list for a blocker. The Entropy™ tool or other embodiments are extremely effective in finding these circuit nodes, as the benchmark circuit data indicates. They can be uninitialized flops and latches, tri-state busses hanging in the Z state, clock inputs (or other PIs) locked into the X or Z states, memory outputs, black box outputs, misconfigured LogicVision™ or Synopsys™ test hardware, malfunctioning clock gaters (gating circuits), tied-off logic gates, or even logic gates with missing input wiring.

After that, Entropy™ tool or other embodiments forward traces from the X/Z generator to all POs in the fanout cone to estimate the untestable fault count caused by the generator. For some gates, such as inverters, buffers, XORs, and XNORs, this is deterministic, because once the gate gets an X on its input, all of its fanout goes into the X state. However, for other gates that have side inputs with the possibility of controlling values (e.g., an AND gate with a 0 on the side input), Entropy™ tool or other embodiments computes the probability of the side input being non-controlling. Then, it calculates the expectation of the number of untestable faults in the fanout of that gate (this is a random variable). This function is recursive. Note that in a "nostopatscan" mode, this fault estimation includes a forward trace of all scan chains that are corrupted by the insertion of an X/Z value. This option weights X/Z generators that corrupt the first few bits of a scan chain much more heavily than generators that only corrupt the last bit. The problem with the X/Z blocker feature is the large CPU time that tracing requires. However, the results in Table 19 indicate that the CPU time is worthwhile.

Entropy™ automatically selects among the various X/Z generators for places to insert blockers. There are elements of ATPG (automatic test-pattern generation) algorithms in, for example, the Entropy™ tool's backtrace to find the X/Z generators, and its forward trace to estimate the fault coverage. However, unlike an ATPG algorithm, various embodiments can purely backtrace to find X/Z generators, and mostly forward trace to estimate fault coverage. But Tetramax™, an ATPG algorithm, will alternately forward and back trace during ATPG, which uses considerably more time than needed with the various embodiments described herein when applied to each fault individually. The Entropy™ tool or other embodiments never shifts forwards and backwards between time frames as Tetramax™ does. The Entropy™ tool or other embodiments simulates forward in increasing time. This is why the algorithms of the various embodiments are is faster than ATPG algorithms for fault coverage estimation.

Figure 8:
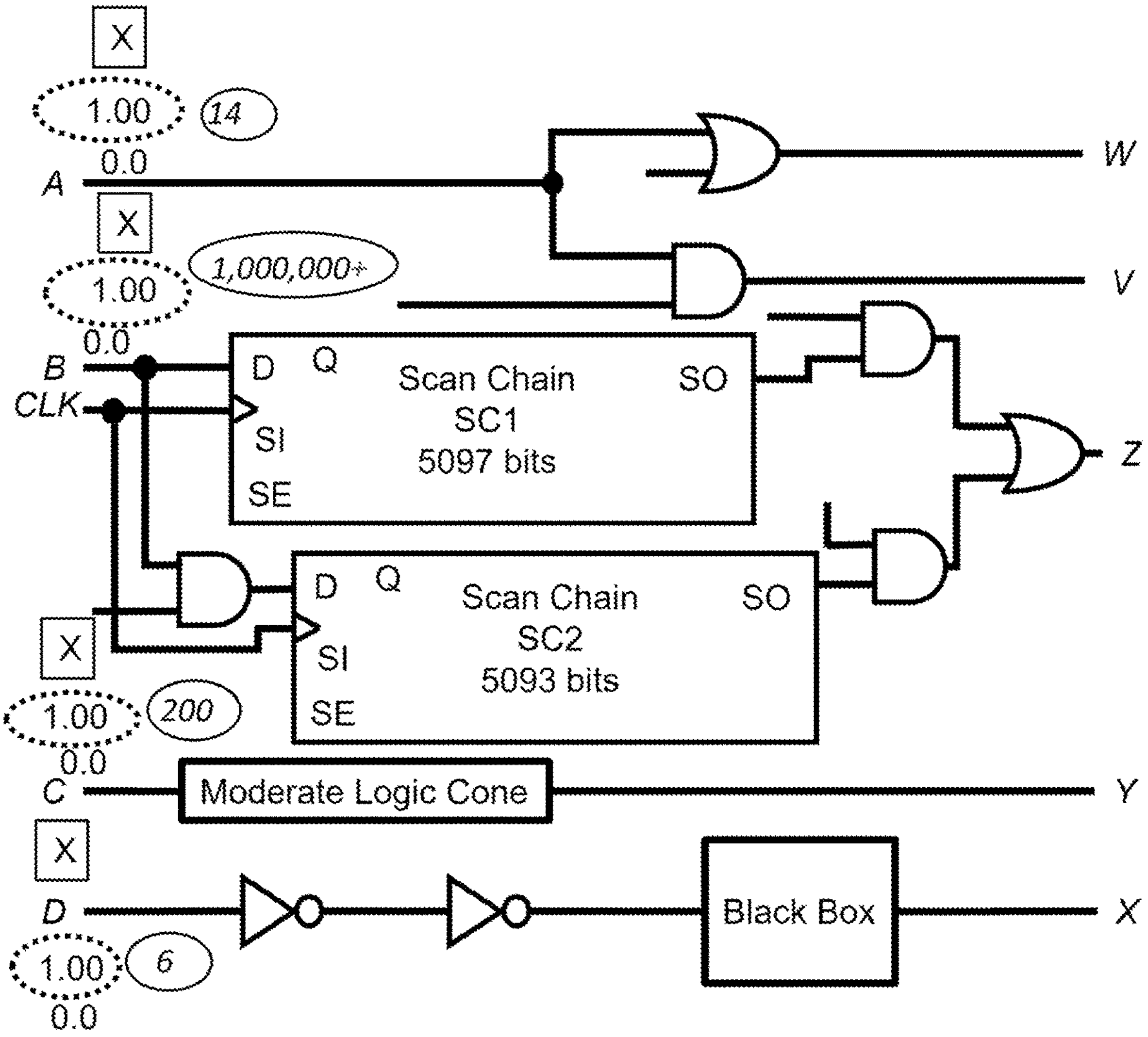
FIG. 8 schematically illustrates problems with structures similar to those in a circuit graphics controller.

Example. The Entropy™ tool or other embodiments populates the blocker/test point candidate list with estimates of the number of untestable faults caused by each X/Z generator. The problem with the Graphics Cont. circuit is that it has many tens of thousands of X/Z generators, most of which have an X/Z fraction of 1.0. The prior Entropy™ tool or other embodiments cost function ("-upprior") first sorted the candidates by lowest level number in the circuit, and then used the cost function (fraction of time generating X/Z or entropy) to break ties. FIG. 8 shows why this failed with an example similar to Graphics Cont. Consider blocker sites A, B, C, and D as shown in FIG. 8. All four of them have an X/Z fraction of 1.00 (circled) and an entropy of 0.0 (boxed), meaning that the signals are always X or Z and therefore their information flow is 0.0. The logic values are in black (they are all X) and the numbers of untestable faults are in purple italics. They are all at the same level in the circuit. However, site A is not worth blocking, as it has only a few circuit lines in its fanout, so it has minimal fault loss. Site B has ~1,000,000 faults that it causes to be untestable in its fanout, largely because it corrupts many bits of scan chains. Site C has 200 faults that it causes to be untestable in its fanout. Finally, site D goes into a black box after two inverters, so there is no point in blocking it. Under the prior cost function, Entropy™ tool or other embodiments would have considered all four sites equivalent and would have chosen randomly among the four blocker sites. The -blkflt version of Entropy™ tool or other embodiments sorts the list based on the number of untestable faults that the X/Z generators cause. The priority then is B, C, A, and D, with only B and C getting blockers. This change makes the -blkflt Entropy™ tool or other version embodiments much more effective than earlier ones, while using much less test hardware. A similar -tpflt option applies fault estimation to the test point selection process, based on Entropy measures.

The FIG. 8 schematic illustrates problems with structures similar to those in a circuit graphics controller. FIG. 8 depicts a circuit with two long scan chains of D flip-flops, one 5097 bits long and the other 5093 bits long. These flip-flops have been chained together so that the test controls, labeled SI (scan in), SO (scan out), and SE (scan enable) can serially shift out their contents while shifting in new contents when SE is enabled. This is commonly done to test huge circuits. However, an unfortunate side effect occurs when a scan chain latches in an unknown (X) signal—the entire contents of the scan chain becomes unknown and the circuit is untestable. Entropy eliminates this problem by estimating the number of lost faults (from untestability) of scan chains due to catching X's. Inputs A, B, C, and D to the circuit are shown in black. All four signals are set to X (in a box). The numbers 1.00 in dotted ellipses indicate that the four signals are either in the X or Z state 100% of the time. The entropy (information flow) is therefore 0.0 as shown in ordinary test Finally, the fault loss estimator estimates the lost (untestable) faults that are shown in solid ellipses. This provides a way to prioritize correction of the four input signals with blockers or test points. Without the fault loss data, Entropy would randomly select among A, B, C, D for a place to insert a test point. With the fault loss data, however, Entropy will first fix the problem at input B (due to the huge number of lost faults), and then fix signal C. It will not bother with signals A and D because the number of lost faults is minimal.

Table 4 depicts Fault Loss Estimation Calibration Circuits including estimated and actual values as indicated, wherein Unc means uncontrollable signal, Uno means unobservable signal. Table 4 shows error estimates for Entropy's fault loss on 10 small calibration circuits. The average error is 9.3%, and this is distorted because of the small circuit sizes. The error will be within 9% on large circuits.

TABLE 4

| | | | | | | | Estimated Lost Faults | | | | | | | |
|---|---|---|---|---|---|---|---|---|---|---|---|---|---|---|
| | # | # | # | # | # | Instance/ | Constraint | | X/Z Gen. | | | Actual | Total | Error |
| Circuit | PI | PO | Gate | FF | Lat | Port | Unc | Uno | Unc | Uno | Total | Loss | Flts. | (%) |
| est1 | 6 | 1 | 12 | 0 | 0 | i2/Z | 4 | 52 | 0 | 0 | 56 | 58 | 60 | 3.4 |
| mrfaulty2 | 8 | 1 | 7 | 0 | 1 | i7/Z | 0 | 0 | 2 | 31 | 33 | 34 | 34 | 2.9 |
| mrfaulty3 | 8 | 2 | 8 | 0 | 1 | i1/Q | 0 | 0 | 4 | 20 | 34 | 30 | 40 | 10.0 |
| | | | | | | i6/Z | 0 | 0 | 1 | 9 | | | | |
| mrfaulty4 | 5 | 1 | 7 | 0 | 1 | i7/Z | 0 | 0 | 1 | 28 | 29 | 29 | 30 | 0.0 |
| mrfaulty5 | 11 | 3 | 13 | 1 | 1 | i2/Z | 0 | 0 | 2 | 14 | 32 | 17 | 66 | 22.7 |
| | | | | | | i6/Z | 0 | 0 | 1 | 15 | | | | |
| mrfaulty6 | 6 | 2 | 8 | 0 | 0 | i7/Z | 0 | 0 | 3 | 48 | 54 | 46 | 50 | 16.0 |
| | | | | | | i5/Z | 0 | 0 | 3 | 0 | | | | |
| mrfaulty7 | 9 | 5 | 9 | 0 | 0 | i7/Z | 0 | 0 | 3 | 48 | 54 | 60 | 62 | 9.7 |
| | | | | | | i5/Z | 0 | 0 | 3 | 0 | | | | |

TABLE 4-continued

| | | | | | | | Estimated Lost Faults | | | | | | | |
|---|---|---|---|---|---|---|---|---|---|---|---|---|---|---|
| | # | # | # | # | # | Instance/ | Constraint | | X/Z Gen. | | | Actual | Total | Error |
| Circuit | PI | PO | Gate | FF | Lat | Port | Unc | Uno | Unc | Uno | Total | Loss | Flts. | (%) |
| mrfaulty8 | 2 | 4 | 16 | 0 | 0 | e5/Z | 0 | 0 | 0 | 0 | 38 | 0 | 72 | 52.8 |
| mrfaulty9 | 1 | 133 | 134 | 0 | 0 | b/some__sig | 0 | 0 | 2 | 534 | 536 | 536 | 536 | 0.0 |
| nasty | 3 | 2 | 2 | 3 | 0 | NONE | 0 | 0 | 0 | 0 | 0 | 0 | 24 | 0.0 |
| mrfaulty10 | 5 | 5 | 15 | 4 | 0 | al/f/i1/Z | 0 | 0 | 6 | 74 | 80 | 78 | 112 | 1.8 |
| mrfaulty11 | 6 | 2 | 10 | 0 | 0 | box2/0, 1 | 0 | 0 | 0 | 20 | 32 | 32 | 32 | 0.0 |
| | | | | | | box1 | 0 | 0 | 0 | 12 | | | | |
| mrfaulty12 | 5 | 5 | 43 | 4 | 0 | e8/Q | 0 | 0 | 58 | 0 | 70 | 74 | 200 | 2.0 |
| | | | | | | d4/114/Q | 0 | 0 | 4 | 0 | 4 | | | |
| | | | | | | a/f/12/QN | 0 | 0 | 4 | 0 | 4 | | | |
| | | | | | | b2/111/QN | 0 | 0 | 4 | 0 | 4 | | | |
| Average | 6 | 13 | 22 | 1 | 0 | | | | | | | | | 9.33 |

8. Complexity Analysis of Algorithms 1-5

The computational complexity of a sequential circuit logic simulation is O(#input vectors×#logic gates$^2$), because in the worst case, we have to simulate all gates for a number of clock periods proportional to the #logic gates, and for the #input vectors, which is set by the designer. The #tournaments is also set by the designer. Tables 5-9 provide the complexity analysis.

Tables 5-9 depict the computational complexity of the steps of, respectively, Algorithms 1-5.

8.1 Algorithm 1—Locating X/Z Generators

TABLE 5

| Step | Computational Complexity |
|---|---|
| 1 | O(# input vectors × # logic gates$^2$) |
| 2 | O(# tournaments) |
| 2A | O(# logic gates) |
| 2B | O(# logic gates) |
| 2Bi | N/A |
| 2Bii | O(# logic gates) |
| 2Biia | N/A |
| 2Biib | O(# logic gates) |
| Total | O(# input vectors × # logic gates$^2$ + # tournaments × # logic gates$^2$) = O(# logic gates$^2$ × (# input vectors + # tournaments)) |

8.2 Algorithm 2—Estimation of Untestable Faults Due to X/Z Generators

TABLE 6

| Step | Computational Complexity |
|---|---|
| 1 | O(# logic gates$^2$ × (# input vectors + # tournaments)) |
| 2 | O(# blockers) |
| 2A | N/A |
| 2B | O(# logic gates) |
| 2Bi | N/A |
| 2Bia | N/A |
| 2Bib | N/A |
| 2C | N/A |
| Total | O(# logic gates$^2$ × (# input vectors + # tournaments) + # blockers × # logic gates) = O(# logic gates$^2$ × (# input vectors + # tournaments)) |

8.3 Algorithm 3—Estimation of Uncontrollable Unobservable Untestable Faults

TABLE 7

| Step | Computational Complexity |
|---|---|
| 1 | O(# input vectors × # logic gates$^2$) |
| 2 | O(# test point candidates) |
| 2A | N/A |
| 2B | O(# logic gates) |
| 2Bi | N/A |
| 3 | N/A |
| Total | O(# input vectors × # logic gates$^2$ + # test point candidates × logic gates) = O(# input vectors × # logic gates$^2$) |

8.4 Algorithm 4—Automatic X/Z Blocker Insertion

TABLE 8

| Step | Computational Complexity |
|---|---|
| 1 | O(# logic gates$^2$ × (# input vectors + # tournaments) |
| 2 | O(# blockers) |
| 3 | O(# tournaments) |
| 3A | O(# blockers) |
| 3B | O(# logic gates) |
| 3C | N/A |
| 3D | N/A |
| Total | O(# logic gates$^2$ × (# input vectors + # tournaments) + (# tournaments × # blockers × # logic gates)) = O(# logic gates$^2$ × (# input vectors + # tournaments)) |

8.5 Algorithm 5—Automatic Test Point Insertion

TABLE 9

| Step | Computational Complexity |
|---|---|
| 1 | O(# logic gates$^2$ × (# input vectors + # tournaments)) |
| 2 | O(# input vectors × # logic gates$^2$) |
| 3 | O(# logic gates) |
| 4 | O(# logic gates) |
| 5 | O(# tournaments) |
| 5A | O(# logic gates) |
| 5B | O(# logic gates) |

TABLE 9-continued

| Step | Computational Complexity |
|---|---|
| 5C | N/A |
| 5D | N/A |
| Total | O(# logic gates$^2$ × (# input vectors + # tournaments) + (# tournaments × # logic gates)) = O(# logic gates$^2$ × (# input vectors + # tournaments)) |

9. Entropy Gain and Entropy Derivative Cost Functions

So far, we have used Entropy as a cost function for siting test points during optimization. Entropy measures information flow in a hardware signal, with a maximum value of 1.0. We now define a new cost function, Entropy Gain, which measures the improvement in the entropy of a test point site and all of its fanouts were a test point to be placed there. We also define the Entropy Derivative cost function, which measures the difference between the entropy of a hardware device and the entropy of its fanout with the highest entropy. Both of these two new measures have been shown to improve the circuit test coverage, while reducing the number of test points added.

These measures should be used as tie breakers between multiple test points having the same Entropy. All of the test point insertion algorithms using these new measures would produce a sorted list of test point sites, sorted from lowest Entropy to highest. In the case of sites with identical Entropies, we calculate the Entropy Gain from inserting a test point at each site and pick the site with the highest Entropy Gain for a test point. If we instead use Entropy Derivative as a secondary cost function, we follow the same procedure. When there are no test points with identical Entropy values, we avoid the computing overhead of calculating Entropy Gain or Derivative values.

10. Experimental Results 10.0 Industrial Circuits Used for These Experiments

Table 10 depicts a summary of Industrial Telecommunications Benchmarks. Specifically, Table 10 lists the five large industrial benchmark circuits. These netlists are used for these experiments with the permission of the originators. µProc Core is a microprocessor core from a larger design consisting of multiple microprocessor cores, embedded memories, E-Fuse, DLL (delay-locked loops), IOs, and multiple analog blocks. Design Periph. Cont. is a high-volume microprocessor peripheral controller, and design Graphics Cont. is a high-volume microprocessor graphics controller. Design µProc. 2 is an industrial microprocessor and µProc. 1 is a high-volume 32-bit industrial microprocessor.

TABLE 10

| Circuit | # PIs | # IOs | # POs | # Gates (K) | # Flip-Flops | # Latches | # Memories |
|---|---|---|---|---|---|---|---|
| µProc Core. | 135 | 0 | 76 | 457.032 | 23,732 | 512 | 0 |
| Periph. Cont. | 782 | 0 | 639 | 1,194.964 | 59,335 | 10,065 | 30 |
| Graphics Cont. | 785 | 0 | 1,034 | 2,679.067 | 123,582 | 4,464 | 120 |
| µProc. 2 | 191 | 0 | 238 | 49.191 | 4,312 | 114 | 0 |
| µProc. 1 | 469 | 0 | 458 | 502.918 | 41,922 | 3,630 | 400 |
| Ave. | 489 | 0 | 483 | 1,109.001 | 40,524 | 2,704 | 82 |

10.1 Detailed Experimental Results 10.2 Setup for All Netlists

1. Obtain the Verilog netlist, Verilog libraries, Synopsys™ Tetramax constraints, and STIL test protocol file from the customer's synthesis and DFT tool directories.
2. Create the memory model and constraints files for the design, using the customer's Synopsys™ constraints file and memory setup Verilog files.
3. Set the parameters for Entropy™ tool or other embodiments. In particular, estimate the number of test points that will lead to 2% hardware overhead. We use the -blkflt and -tpflt options, which select test point sites based first on entropy and secondly on untestable fault counts. Sometimes, we use the -upprior option, which selects test point sites based first on their proximity to primary inputs, and secondly on their entropy.
4. Obtain and modify the customer's DC_shell™ and Tetramax™ flows to use the location files produced by Entropy™ tool or other embodiments for DFT test point insertion.
5. Use standard Entropy flows on µProc. Core, Periph. Cont., Graphics Cont., µProc. 1, and µProc. 2. Run Entropy™ tool or other embodiments and write out a test point location file for Dc_shell™. Dc_shell™ inserts the test points using the customer's procedures and the Entropy™ tool or other embodiments location file. Run the automatic test-pattern generator (ATPG) Tetramax™ to get results for stuck-at, transition delay, and IDDQ faults. For the µProc. Core, the corresponding Mentor Graphics™ tools were used, instead.

Multiple runs were performed, to plot data from the following experiments:

6.1. Plot the entropy initialization values after netlist warmup as a function of the number of warmup vectors. This determines what vector count is needed for successful circuit initialization.

6.2. Plot the entropy distribution improvement as a function of the number of test points inserted. This determined when more test points led to diminishing returns.

6.3. Plot the test volume reduction, test application time reduction, and test efficiency improvement as a function of the number of test points inserted. This was performed by running an industrial ATPG tool on the netlist produced by Entropy™ tool or other embodiments to determine the actual benefit of Entropy™ tool or other embodiments. For Periph. Cont. and µProc. 2, we plotted the results from using just control-only, just observe-only, or both kinds of test points.

6.4. Run Entropy™ tool or other embodiments with the -xzreport option only to produce a report (in decreasing frequency) of the devices that are X/Z generators, in the recommended order of insertion. Then, run Tetramax, inserting the test points recommended by Entropy™ in the recommended order. Record changes in Test Coverage and Test Vector count, as well as all CPU times.

Experiment 6.1 was only performed on μProc. Core but Experiments 6.2 and 6.3 were performed on all netlists except Graphics Cont. and μProc. 1. Experiment 6.4 was only performed on Graphics Cont. and μProc. 1. In all tables, TEST Signals is the number of control signals (i.e., if there are 10, the ATPG tool can independently turn on or off 10 groups of test points with each of 10 signals, in order to provide additional test modes). SAF refers to stuck-at faults. Test Cov. means test coverage. ENT CPU Time is the Entropy™ tool CPU time. The equations for Test Application Time (TAT) and Test Volume (TV) used here are:

Test Volume(TV)=(#primary_inputs+#flip_flops+1)× #test_vectors

Test Application Time(TAT)=((#test_vectors+2)× max_scan_length)+#test_vectors+4

10.3 Fault Loss Estimation Experiments 10.3.1 uProc. 1 Experiment

Experiment 6.4 was run with EntropyXZ™ on μProc. 1 with the following options:

- Report fault loss for the 30,000 most important blocker and test point sites
- Simulate 100000 clock periods to initialize the circuit (-warm 100000)
- Simulate 3000 clock periods for the first and only tournament (-upd 3000)
- Terminate if the entropies of all signals exceed 0.35 (-ethresh 0.35)
- Consider any signal that ever has an X/Z value for test points (-xzthresh 0.0)
- Insert only sequential (synchronous) test points (-lev 0)
- Sort test point candidates in decreasing order by fault loss (-tpflt)
- Sort signal blocker candidates in decreasing order by fault loss (-blkflt)
- Sort the test points first by lost fault count (-fltfirst).
- Mark redundant signals as NO TOUCH (-notouch)
- Stop at scan chains when counting lost faults (-stopatscan)

Table 11 depicts μProc. 1 Test Point Sites, Statistics, and Fault Coverage due to EntropyXZ™, providing experimental results showing how only nine test points were inserted in the order recommend by EntropyXZ™ in this experiment, which increased Fault Coverage by 0.0858600. Table 11 depicts how inserting only these nine test points recovered 1452 untestable faults (with 899 recovered by Test Point 2 alone), thereby raising the Test Coverage from 98.85% to 98.94%, an increase of 0.09%. This overnight run of EntropyXZ™ (in 10.06 CPU hours) saved several weeks of manual engineering work.

TABLE 11

| EntropyXZ | | | | | | Tetramax | EntropyXZ |
|---|---|---|---|---|---|---|---|
| TP # | Ver | Hierarchical Instance Name/Port or Signal | Lev | X or Z Frac | Ent | Fault Cov (FC) | FC Increase |
| | | Baseline μProc. 1 (no Test Points) with 25 Q lines disconnected | | | | 97.211568 | |
| 1 | X | \u_arm1136js_toplevel!u_l2cc!u_l2cc_noram! u_l2cc_write_buffer!data0_reg_reg[199]/q | 12 | 1.000 | 0.062 | 97.215300 | 0.00373 |
| 2 | X | u_mProc. 1_ctcm/icc_placeopt_669/z | 8 | 0.040 | 0.132 | 97.269404 | 0.05410 |
| 3 | X | u_mProc. 1_ctcm/icc_placeopt_228/z | 10 | 0.040 | 0.132 | 97.273058 | 0.00365 |
| 4 | X | u_mProc. 1_ctcm/icc_placeopt_629/z | 10 | 0.040 | 0.132 | 97.282127 | 0.00907 |
| 5 | X | u_mProc. 1_ctcm/icc_placeopt_735/z | 9 | 0.040 | 0.132 | 97.292774 | 0.01065 |
| 6 | X | CBDFT_IB_tcr_cgc_atpg_ctrl_wrap_reg362/q | −1 | 0.040 | 0.482 | 97.293274 | 0.00050 |
| 7 | X | u_mProc. 1_ctcm/icc_placeopt_350/z | 9 | 0.040 | 0.132 | 97.296620 | 0.00335 |
| 8 | A | CBDFT_OB_a11p_haddr[22]_wrap_reg103/q | −1 | 0.721 | 0.139 | 97.297424 | 0.00080 |
| 9 | X | dftstitch_327/z | −1 | 0.220 | 0.218 | 97.297424 | 0.00000 |
| Totals | | | | | | | 0.08586 |

TABLE 12

| EntropyXZ | | | | | | Tetramax | Tetramax | | | EntropyXZ |
|---|---|---|---|---|---|---|---|---|---|---|
| | Fault Loss Estimate | | | | | | | | | |
| | | Constrained | | X or Z Gen or Untest | | Test Cov. | TC | | Pattern | Test Point |
| TP # | Recovered Faults | NC | NO | NC | NO | (TC) | Improvement | Patterns | Decrease | Type |
| | | Baseline | | | | 98.85000 | | 1706 | | |
| 1 | 73 | | | 11592 | 34 | 98.85000 | 0.00000 | 1692 | 14 | blocker |
| 2 | 899 | | | 66844 | 0 | 98.92000 | 0.07000 | 1720 | −28 | c-to-1-&-obs |
| 3 | 62 | | | 5348 | 0 | 98.92000 | 0.00000 | 1688 | 32 | c-to-1 |
| 4 | 151 | | | 5112 | 0 | 98.93000 | 0.01000 | 1683 | 5 | c-to-1 |
| 5 | 175 | | | 4164 | 0 | 98.94000 | 0.01000 | 1687 | −4 | c-to-1-and-obs |
| 6 | 16 | | | 3206 | 14 | 98.94000 | 0.00000 | 1685 | 2 | blocker |
| 7 | 55 | | | 2288 | 0 | 98.95000 | 0.01000 | 1684 | 1 | c-to-1-&-obs |

TABLE 12-continued

| TP # | EntropyXZ Recovered Faults | Fault Loss Estimate: Constrained NC | Constrained NO | X or Z Gen or Untest NC | X or Z Gen or Untest NO | Tetramax Test Cov. (TC) | Tetramax TC Improvement | Tetramax Patterns | Tetramax Pattern Decrease | EntropyXZ Test Point Type |
|---|---|---|---|---|---|---|---|---|---|---|
| 8 | 21 | | | 1676 | 30 | 98.94000 | −0.01000 | 1722 | −38 | blocker |
| 9 | 0 | | | 0 | 88 | 98.94000 | 0.00000 | 1722 | 0 | observe-only |
| T | 1452 | | | 100230 | 166 | | 0.09000 | | −16 | |

10.3.2. Gryphics Cont. Experiment

Table 12 depicts test points selected by Entropy™ for the Circuit Graphics Cont. experiment and the results from automatic test pattern generation. Specifically, Table 13 shows the nine test point sites selected by Entropy™ for the Graphics Cont. circuit, which resulted in detecting 653,389 additional faults. This shows the great benefit of its various backtracing algorithms to eliminate X/Z signals in the circuit.

TABLE 13

| Lvl | X/Z Frac | Ent | Lost Faults | Verilog Instance Name/Port |
|---|---|---|---|---|
| 3 | 1.0 | 0.0 | 91,927 | u_mdp_core_top/u_mdp_cmd/U502/instCombUdp0/x2/z |
| 3 | 1.0 | 0.0 | 91,877 | u_mdp_core_top/u_mdp_cmd/U511/instCombUdp0/x2/z |
| 16 | 1.0 | 0.0 | 81,505 | u_mdp_core_top/U88/instCombUdp0/x2/z |
| 2 | 1.0 | 0.0 | 72,002 | u_mdp_core_top/gc_waverider_group_2_MBIST_I1/MBIST PG_REPEAT_LOOP_CNTRL/lvmbist 86/z |
| 17 | 1.0 | 0.0 | 67,353 | u_mdp_core_top/U86/instCombUdp0/x1/z/z |
| 18 | 1.0 | 0.0 | 67,351 | u_mdp_core_top/U86/instCombUdp0/x2 |
| 5 | 1.0 | 0.0 | 67,272 | u_mdp_core_top/gc_waverider_group_2_MBIST_I1/MBIST PG_FSM/lvmbist_10/z |
| 2 | 1.0 | 0.0 | 57,064 | u_mdp_core_top/gc_waverider_group_2_MBIST_I1/MBIST PG_ADD_GEN/lvmbist_290/z |
| 3 | 1.0 | 0.0 | 57,038 | u_mdp_core_top/gc_waverider_group_2_MBIST_I1/ MBIST_ADD_GEN/lvmbist_323/z |
| | | | 653,389 | Faults made testable by inserting these 9 test points |

flop, to cut the hardware overhead to 3.000%. In Spectral's test point library, the scan flip-flop overhead is 24 transistors, but the overhead of an XORing network for 8 signals and a scan flop is 80 transistors. The former has an overhead of #test-points×24, while the latter has #test-points×10. A 5-input XORing approach has an overhead of #test-points×11.2, and a 4-input one has an overhead of #test-points×12. Test generation ran with a Synopsys™ scan chain decompressor and response compacter.

10.4 Test Vector Reduction Experiments 10.4. Case Periph. Cont.: High Volume Microprocessor Peripheral Chip Periph. Cont. is a reasonably testable microprocessor peripheral chip. All address and data lines of all memories were scanned, and all control lines were XORed into one of the memory outputs. Tables 14-16 show the results of the Entropy™ run on circuit Periph. Cont. The Entropy™ options were 100,000 warmup vectors, 1,000 update vectors per tournament, inserting 150 test points in each tournament, use average fanout stem observability, use exact simulation, and -upprior. The exception is the revalidation both run, which used 2,000 update vectors per tournament. We assumed that every 8 observation points were XORed into a new scan chain flip-flop, and that all such observation flip-flops were clustered into their own scan chains. We assumed a maximum scan chain length of 150. Every 8 observation points are XORed into an additional scan flip-flop, to cut the hardware overhead to 3.000%.

Table 14 depicts results for Periph. Cont. Circuit Experiment 6.3, with 10 TEST Signals run in a compressed mode and an IDDQ vector count of 51. Table 15 depicts results for Periph. Cont. Circuit Hardware Overhead, TAT, TV, and CPU Times #. Table 16 depicts a Periph. Cont. Stuck-At Fault Report. Tables 14-15 give statistics on Periph. Cont. Table 16 shows the distributions of stuck-at faults for Periph. Cont. at the end of ATPG. The Entropy™ tool or other embodiments may continuously insert additional primary inputs and test points into the circuit during these iterations. Charts 1-2 show the results of inserting both control and observe test points. For IDDQ tests, the insertion of both test point kinds increased the test coverage from 78.35% to 83.38%. All tests ran with test data compression with an IDDQ vector count of 51.

TABLE 14

| Test Point Type | # Test Points | Stuck-faults # Vec. | Stuck-faults % Vec. Red. | Stuck-faults Test Cov. (%) | Transition Delay # Vec. | Transition Delay % Vec. Red. | Transition Delay Test Cov. (%) | IDDQ! Test Cov. (%) |
|---|---|---|---|---|---|---|---|---|
| Baseline | 0 | 2997 | 0.00 | 98.73 | 27463 | 0.00 | 74.67 | 78.35 |
| Control-only | 15000 | 2264 | 24.46 | 98.83 | 6913 | 74.83 | 98.50 | 84.96 |
| Observe-only | 15000 | 2295 | 23.42 | 98.83 | 6929 | 74.75 | 98.51 | 85.04 |
| Both | 15000 | 2193 | 26.83 | 98.86 | 6252 | 77.23 | 98.66 | 83.38 |

TABLE 15

| Test Point Type | Transistor Overhead (%) | Stuck-at Faults TAT (clks) | Stuck-at Faults % TAT Red. | Stuck-at Faults TV (bits) | Transition Delay Faults TAT (clks) | Transition Delay Faults % TAT Red. | Transition Delay Faults TV (bits) | ENT CPU Time (s) | SAF ATPG CPU Time (s) |
|---|---|---|---|---|---|---|---|---|---|
| Baseline | 0.000 | 194,937 | 0.00 | 180,173,646 | 1,785,227 | 0.00 | 1,652,222,994 | 0 | 1261 |
| Control-only | 1.178 | 147,292 | 24.44 | 136,107,152 | 449,477 | 74.82 | 415,595,734 | 23,286 | 49 |
| Observe-only | 1.178 | 149,307 | 23.41 | 137,970,810 | 450,517 | 74.76 | 416,557,622 | 20,350 | 49 |
| Both | 3.000 | 142,677 | 26.81 | 131,838,774 | 406,512 | 77.23 | 375,857,736 | 22,605 | 43 |

TABLE 16

| Fault Class | Code | Fault Count BOTH CONTROL AND OBSERVE TEST POINTS |
|---|---|---|
| Detected | DT | 2,389,992 |
| Possibly Detected | PT | 453 |
| Undetectable | UD | 44,041 |
| ATPG Untestable | AU | 27,091 |
| Not Detected | ND | 317 |
| Total | | 2,461,894 |

10.4.2. Case uProc Core: Industrial ASIC Netlist

μProc. Core is a typical microprocessor core in a multi-core design. The address and data lines of all memories were scanned, and all control lines were XORed into one of the memory outputs. The maximum scan chain length was 64 and 10 Test Control signals were used. As a result of Experiment 6.1 on μProc Core the number of Test Vectors dropped by more than 40% due to the test points.

10.4.3 Case mProc. 2: Processor Netlist

The μProc. 2 industrial processor was run through Entropy™, and tests were generated for stuck-at, transition delay, and pseudo stuck-at faults for IDDQ testing using 51 vectors. This design has no memories. Tables 17-18 and Charts 7-11 show the results in uncompressed mode. The maximum scan length owas64.

For stuck-at faults, the # of Test Vectors, Test Application Time, and Test Volume fell to 64% of that for the original circuit without DFT hardware (the Before category). The hardware Transistor Overhead is roughly 3%. For transition delay faults, the # of Test Vectors fell to roughly 61% of those for the original circuit without DFT hardware.

Table 17 depicts results for μProc. 2 Circuit Experiment, 1 TEST Control Signal, and Table 18 depicts results for μProc. 2 Circuit Hardware Overhead, TAT, TV, and CPU Times.

TABLE 17

| Test Point Type | # Test Points | Stuck-faults # Vec. | Stuck-faults % Vec. Red. | Stuck-faults Test Cov. (%) | Transition Delay # Vec. | Transition Delay % Vec. Red. | Transition Delay Test Cov. (%) | IDDQ Test Cov. (%) |
|---|---|---|---|---|---|---|---|---|
| Baseline | 0 | 549 | 0.00 | 100.00 | 766 | 0.00 | 99.98 | 97.17 |
| Control-only | 1,300 | 447 | 18.58 | 100.00 | 531 | 30.68 | 99.99 | 99.12 |
| Observe-only | 1,600 | 505 | 8.01 | 100.00 | 682 | 10.97 | 99.98 | 96.82 |
| Both | 853 | 415 | 24.40 | 100.00 | 505 | 34.07 | 99.99 | 98.51 |

TABLE 18

| | | Stuck-at Faults | | | Transition Delay Faults | | | ENT | SAF ATPG |
|---|---|---|---|---|---|---|---|---|---|
| Test Point Type | Transistor Overhead (%) | TAT (clocks) | % TAT Red. | TV (bits) | TAT (clocks) | % TAT Red. | TV (bits) | CPU Time (s) | CPU Time (s) |
| Baseline | 0.000 | 35,817 | 0.00 | 2,472,696 | 49,922 | 0.00 | 3,450,064 | 0 | 5.3 |
| Control-only | 1.982 | 29,187 | 18.51 | 2,013,288 | 34,647 | 30.60 | 2,391,624 | 2,342 | 5.9 |
| Observe-only | 1.251 | 32,957 | 7.99 | 2,274,520 | 44,462 | 10.94 | 3,071,728 | 2,383 | 5.7 |
| Both | 2.193 | 27,107 | 24.32 | 1,869,160 | 32,957 | 33.98 | 2,274,520 | 2,145 | 5.3 |

11. Conclusions from Entropy™ Experiments

Table 19 depicts TAT and TV Reduction due to Test Points Inserted by Entropy™, wherein ~TAT and TV reductions are computed only for stuck-at faults. Table 19 shows the reductions in TAT and TV for all circuits run with Entropy™ in tournament mode with the goal of shortening the test pattern sequence. Both transition delay fault and stuck-at fault vectors are considered. It is obvious from the table that the Entropy™ tool causes an even bigger cost reduction when transition delay faults are accounted for. The Entropy™ tool or other embodiments are highly effective in reducing Test Application Time (TAT) by 30.00 to 72.27%, and on average by 49.21%. TAT is a metric closely related to test cost. The Entropy™ tool or other embodiments works in addition to Test Data Compression Schemes, in order to reduce cost beyond what Test Data Compression can do. The Test Volume (TV) is reduced by Entropy™ by 30.04 to 72.29%, and on average by 49.23%. This directly reduces the cost of expensive ATE memory and pins.

the test points inserted in earlier tournaments. This significantly improves DFT hardware utilization.

Entropy™ gives a test compression ratio of roughly 3.6 in the best case. Test data compression gives a test compression ratio of 10.0 to 25.0. However, Entropy™ tool or other embodiments be used in addition to test data compression to achieve compression ratios of up to 90.0. If the main reason for using test data compression is to get the test vectors to fit into the ATE in only one load, the Entropy™ tool or other embodiments may be able to achieve this without using test data compression. The Entropy™ tool or other embodiments obtains an average 49.21% reduction in TAT and a 49.23% reduction in TV with test data compression. The embodiments also dramatically improve stuck-at fault coverage on circuits where it is low (on highly testable circuits, it only marginally improves it). In many cases, the first 11 test points inserted by Entropy™ tool or other embodiments cause a massive improvement in testability. The Entropy™ tool or other embodiments dramatically improves the transition delay-fault coverage on the Periph. Cont. circuit from

TABLE 19

| | Transistor | TAT (Test Application Time) (clocks) | | | TV (Test Volume) (bits) | | |
|---|---|---|---|---|---|---|---|
| Circuit | Overhead (%) | Before Entropy | After Entropy | % Red. | Before Entropy | After Entropy | % Red. |
| µProc. Core~ | | 493,222 | 269,429 | 45.37 | 181,062,648 | 98,932,860 | 45.36 |
| Periph. Cont. | 3.000 | 1,980,164 | 549,189 | 72.27 | 1,832,396,640 | 507,696,510 | 72.29 |
| µProc. 2 | 2.193 | 85,739 | 60,064 | 30.00 | 5,922,760 | 4,143,680 | 30.04 |
| Average | 2.597 | 853,042 | 292,894 | 49.21 | 673,127,350 | 203,591,017 | 49.23 |

The reason why Entropy™ performs so much better for DFT than conventional testability measures, such as SCOAP (difficulties) and COP (probabilities), is because all other industrially used testability measures assume that all signals in the circuit are completely independent, in order to use an O(N) testability analysis algorithm. This leads to serious errors in placing test points and scan flip-flops, particularly in huge circuits. So, much DFT hardware is put in the wrong places. The Entropy™ method uses logic simulation of random digital white noise on the circuit inputs and I/O pins, using the designer's tied signal constraints. The logic simulator implicitly accounts for all signal correlations, so the entropy testability measure is far more accurate, as demonstrated in Table 19 by the vastly superior results in using DFT hardware effectively. The Entropy™ tool or other embodiments may comprise an $O(N^2)$ algorithm, due to the logic simulation, but the hours of computing are worthwhile for the economic benefits—significantly higher test coverages, a 49.21% reduction in TAT, and a 49.23% reduction in TV. The tournaments in Entropy™ allow later tournaments to have accurate signal probabilities and Entropies, based on an average of 65% to 98%, while dramatically shortening the number of transition delay fault test vectors. The algorithm of the various embodiments very effectively identifies the circuit signals where bad controllability/observability make transition delay fault testing much more difficult. One of the benefits of Entropy™ tool or other embodiments is that the DFT hardware insertion is automatic and controlled by several dozen parameters. This means that DFT insertion can be far less labor intensive than at present. Two or three runs (each taking 12 to 48 CPU hours) will find reasonable settings for the program to ensure great DFT insertion. This is a massive cost saving compared with hiring a test expert for 3 to 6 months to make the design testable.

The results in Table 4 show the dramatic improvement in circuit testability when untestable fault estimates are added to the optimization cost function. Also, the complexity analysis in Tables 5-9 shows that the worst case complexity of these algorithms is only O(#logic gates$^2$×(#input vectors+#tournaments)), which is considerably less than the complexity for automatic test-pattern generation.

Supporting Hardware

Various elements or portions thereof depicted in the various figures and having functions described herein are implemented at least in part via one or more computing devices having appropriate processing, memory, input/output, communications, and other capabilities, elements, or portions thereof. These elements or portions thereof are implemented or instantiated via computing devices of various types, though generally a processor element (e.g., a central processing unit (CPU) or other suitable processor(s)), a memory (e.g., random access memory (RAM), read only memory (ROM), and the like), various communications interfaces, input/output interfaces and the like.

Figure 9:
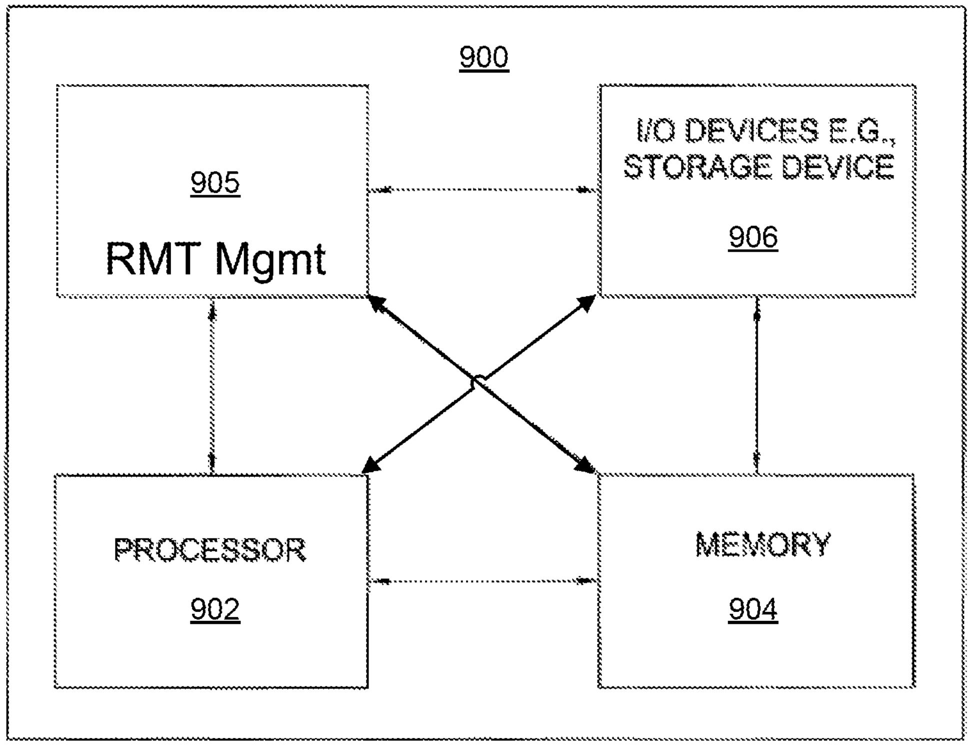
FIG. 9 depicts a high-level block diagram of a general-purpose computer suitable for use in performing various functions according to the embodiments.

For example, FIG. 9 depicts a high-level block diagram of a general-purpose computer suitable for use in performing the functions described herein. Specifically, FIG. 9 depicts a high-level block diagram of a general-purpose computer suitable for use in performing functions such as the calculations, algorithms, methods and so on as described herein with respect to the various embodiments.

As depicted in FIG. 9, the system 900 comprises a processor element 902 (e.g., a CPU), a memory 904, e.g., random access memory (RAM) and/or read only memory (ROM), an RMT management module 905, and various input/output devices 906 (e.g., storage devices, including but not limited to, a tape drive, a floppy drive, a hard disk drive or a compact disk drive, a receiver, a transmitter, a speaker, a display, an output port, and a user input device (such as a keyboard, a keypad, a mouse, and the like)).

It should be noted that aspects of the present invention may be implemented in software and/or in a combination of software and hardware, e.g., using application specific integrated circuits (ASIC), a general-purpose computer or any other hardware equivalents. In one embodiment, the various processes can be loaded into memory 904 and executed by processor 902 to implement the functions as discussed above. As such the processes (including associated data) of the present invention can be stored on a computer readable medium or carrier, e.g., RAM memory, magnetic or optical drive, server, and the like.

It is contemplated that some of the steps discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking the inventive methods may be stored in fixed or removable media, transmitted via a data stream in a broadcast or other signal bearing medium, and/or stored within a memory within a computing device operating according to the instructions.

Figure 10:
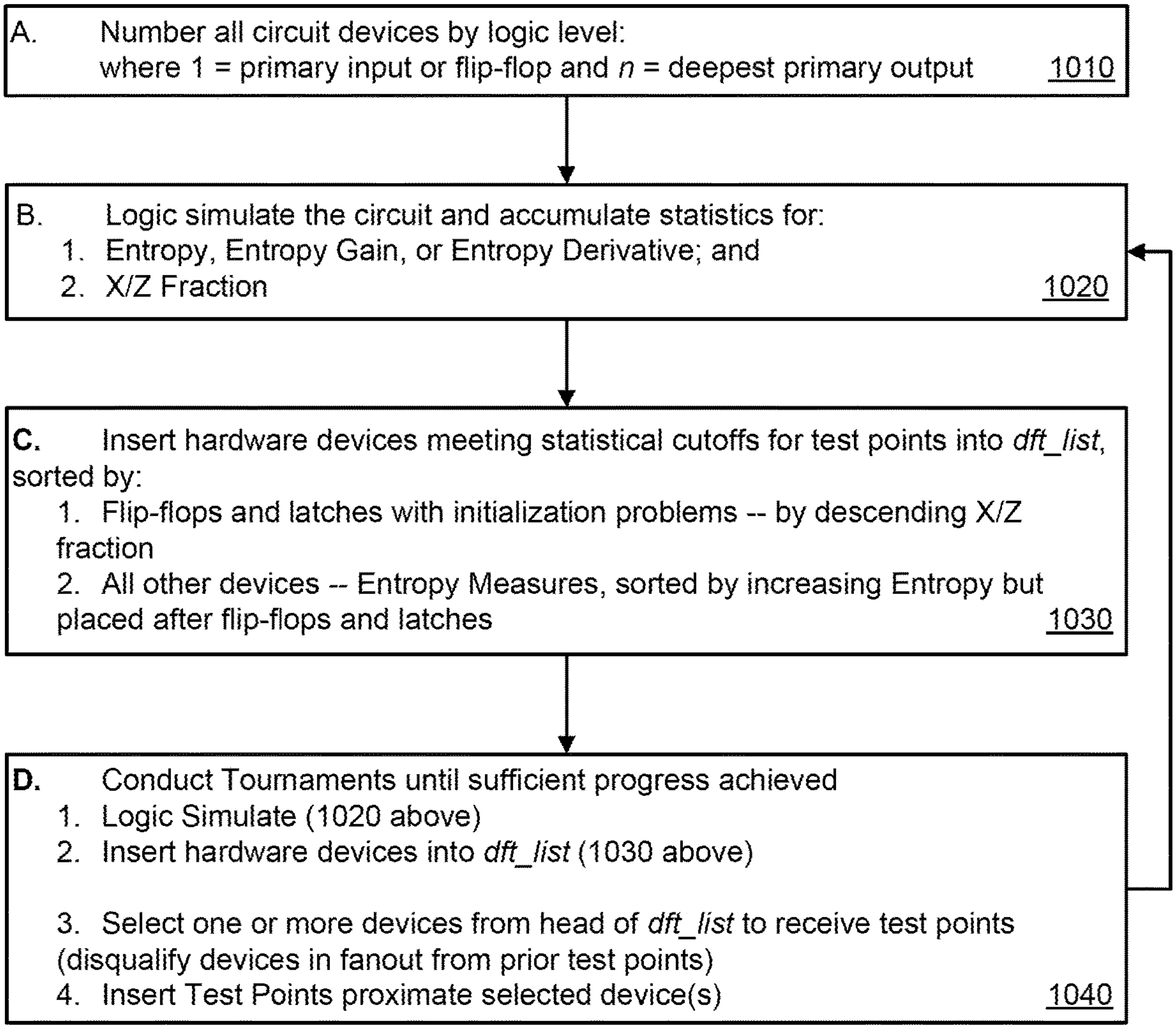
FIG. 10 depicts a flow diagram of a method according to an embodiment.

FIG. 10 depicts a flow diagram of a method according to an embodiment. Specifically, the method 1000 of FIG. 10 comprises a test point optimization algorithm configured for making primary decisions about inserting test points to eliminate uninitialized flip-flops and latches using the fraction of the circuit signals in the X/Z state, and for making secondary decisions on where else to site test points based on metrics such as Entropy, Entropy Gain, and/or Entropy Derivative, as described in more detail above.

At step 1010, all of the circuit devices are numbered by logic level from 1 through n, wherein 1=a primary input or flip-flop, and n is equal to a deepest primary output.

At step 1020, logic simulations are performed on the circuit and devices contained therein to accumulate statistics associated with Logic simulate the circuit and accumulate statistics associated with (1) Entropy, Entropy Gain, and/or Entropy Derivative; and (2) X/Z Fraction such as discussed above.

At step 1030, hardware devices meeting statistical cutoffs for test points are inserted into the dft_list, sorted by: (1) For flop-flops and latches with initialization problems, by descending X/Z fraction; and (2) For all other devices, by Entropy Measures such as by increasing Entropy but placed after flip-flops and latches.

At step 1040, "tournaments" are conducted until sufficient progress is achieved (e.g., there is little, or no progress or improvement made from one tournament to the next). That is, for each iteration of simulation (step 1020) and insertion of hardware devices into the dft_list (step 1030) one or more devices from the head of dft_list are selected to receive test points (disqualify devices in fanout from prior test points) and test points are inserted proximate the selected device(s).

FIG. 10 generally depicts a methodology denoted by the inventor as "basic" entropy optimization, which methodology is deemed by the inventor to be especially useful for a device under test (or portions thereof) having relatively simple combinational and sequential logic circuitry such as to find root cause(s) of uninitialized flip-flops, latches, and the like of a device under test.

Figure 11:
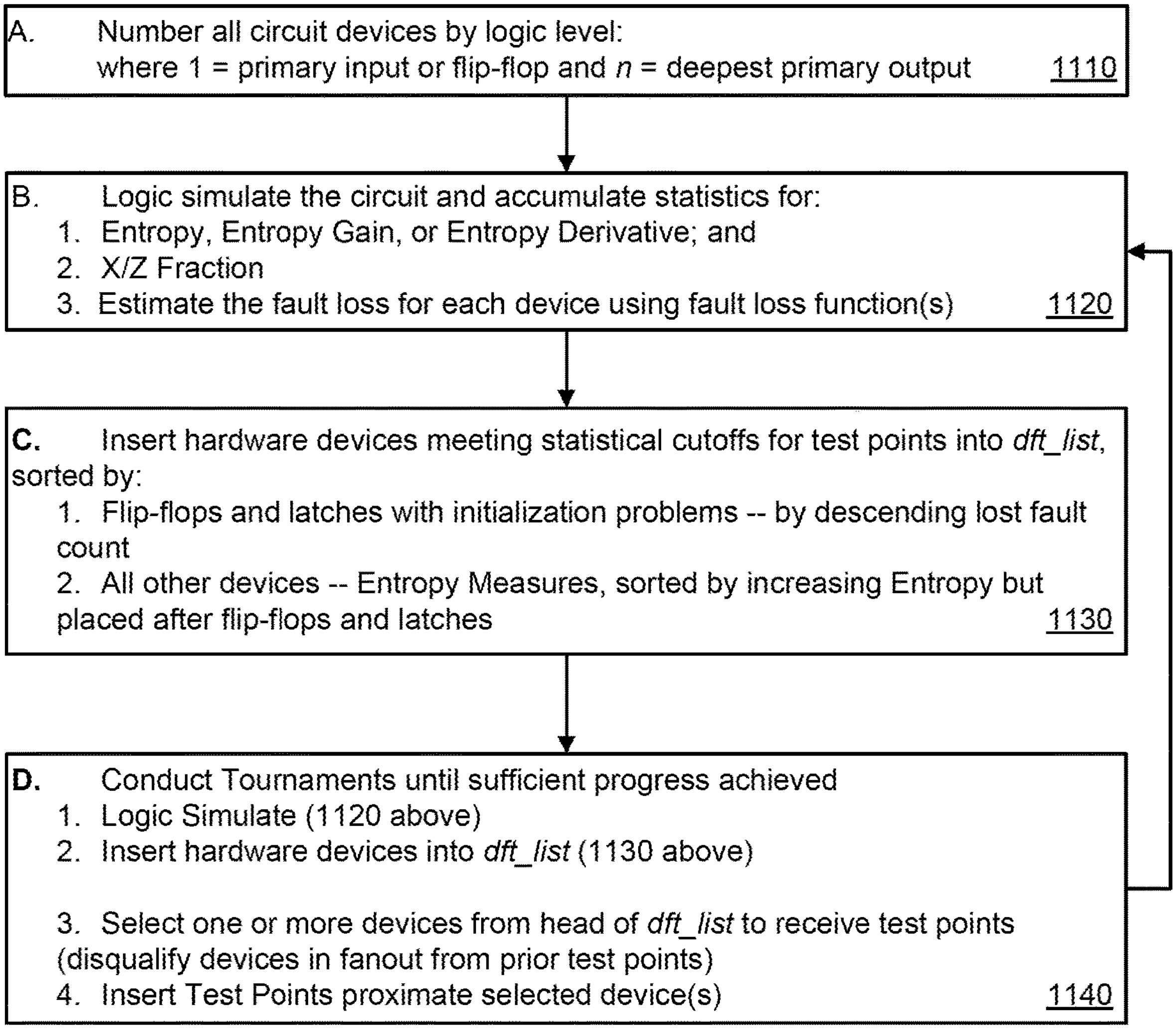
FIGS. 11-14 depicts flow diagrams of modifications to the method of FIG. 10 according to various embodiments.

FIG. 11 depicts modifications to the method of FIG. 10 according to various embodiments. Specifically, the method 1100 of FIG. 11 modifies the method 1000 of FIG. 10 in that decisions about modifying flip-flops and latches are based on estimates of faults whose coverage was lost, as described in more detail above.

At step 1110, all of the circuit devices are numbered by logic level from 1 through n, wherein 1=a primary input or flip-flop, and n is equal to a deepest primary output.

At step 1120, logic simulations are performed on the circuit and devices contained therein to acculuate statistics associated with Logic simulate the circuit and accumulate statistics associated with (1) Entropy, Entropy Gain, and/or Entropy Derivative; and (2) X/Z Fraction such as discussed above. Further, an estimate is made of the fault loss for each device using fault loss functions as described in more detail above.

At step 1130, hardware devices meeting statistical cutoffs for test points are inserted into the dft_list, sorted by: (1) For flop-flops and latches with initialization problems, by descending lost fault count; and (2) For all other devices, by Entropy Measures such as by increasing Entropy but placed after flip-flops and latches.

At step 1140, "tournaments" are conducted until sufficient progress is achieved (e.g., there is little or no progress or improvement made from one tournament to the next). That is, for each iteration of simulation (step 1120) and insertion of hardware devices into the dft_list (step 1130) one or more devices from the head of dft_list are selected to receive test points (disqualify devices in fanout from prior test points) and test points are inserted proximate the selected device(s).

FIG. 11 generally depicts a methodology denoted by the inventor as least fault loss optimization, which methodology is deemed by the inventor to be especially useful for a device under test (or portions thereof) having circuits with relatively complex or elaborate scan chains of a device under test.

Figure 12:
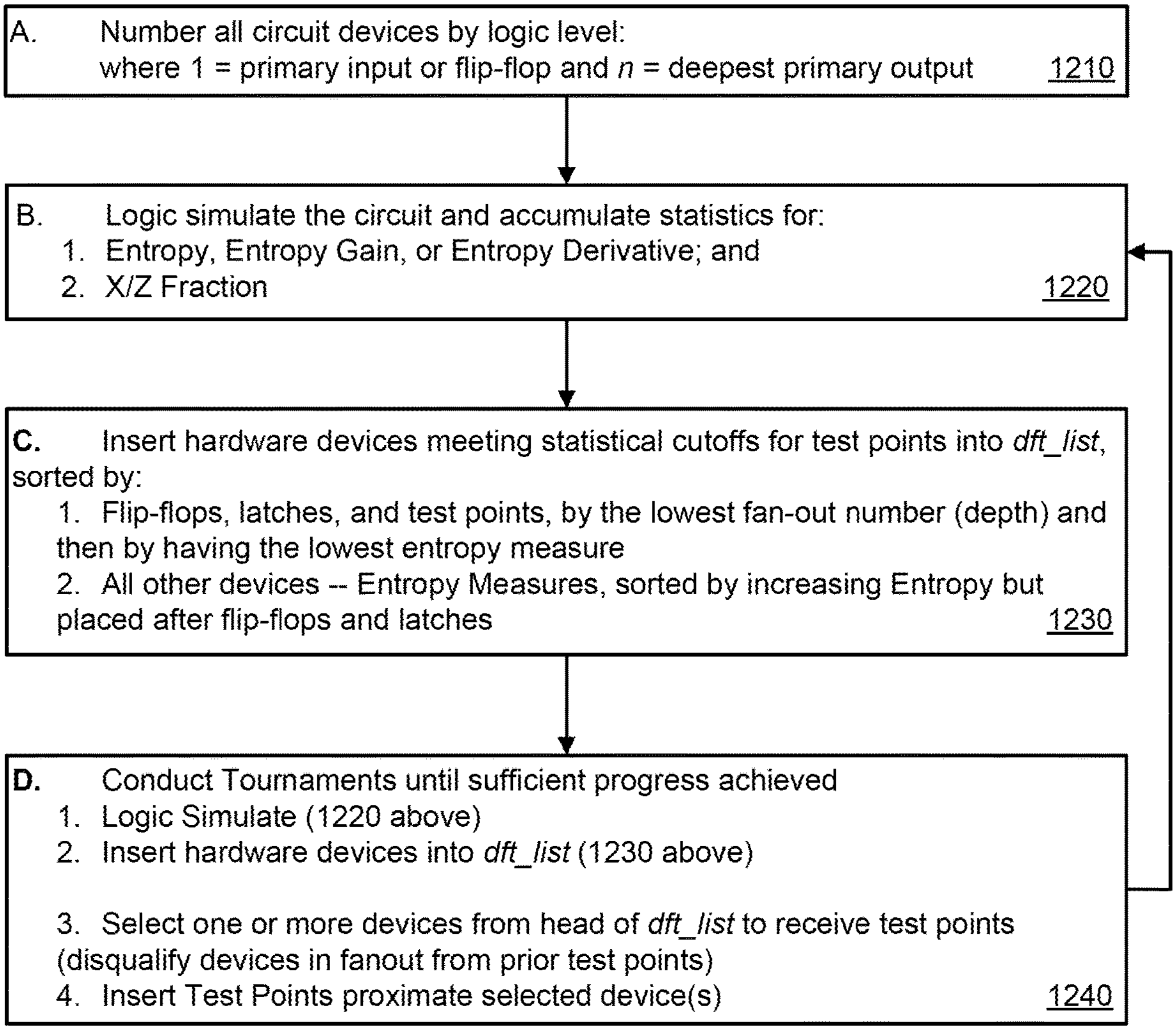

FIG. 12 depicts modifications to the method of FIG. 10 according to various embodiments. Specifically, the method 1200 of FIG. 12 modifies the method 1000 of FIG. 10 in that decisions on siting all testability hardware are based instead on the lowest device level number and, within that, by the Lowest Entropy measure.

At step 1210, all of the circuit devices are numbered by logic level from 1 through n, wherein 1=a primary input or flip-flop, and n is equal to a deepest primary output.

At step 1220, logic simulations are performed on the circuit and devices contained therein to accumulate statistics associated with Logic simulate the circuit and accumulate statistics associated with (1) Entropy, Entropy Gain, and/or Entropy Derivative; and (2) X/Z Fraction such as discussed above.

At step 1230, hardware devices meeting statistical cutoffs for test points are inserted into the dft_list, sorted by: (1) For flop-flops, latches, and test points, by the lowest fan-out number (lowest depth), and then by having the lowest entropy; and (2) For all other devices, by Entropy Measures such as by increasing Entropy but placed after flip-flops and latches;

At step 1240, "tournaments" are conducted until sufficient progress is achieved (e.g., there is little or no progress or improvement made from one tournament to the next). That is, for each iteration of simulation (step 1220) and insertion of hardware devices into the dft_list (step 1230) one or more devices from the head of dft_list are selected to receive test points (disqualify devices in fanout from prior test points) and test points are inserted proximate the selected device(s).

FIG. 12 generally depicts a methodology denoted by the inventor as minimal fault loss with level number, which methodology is deemed by the inventor to be especially useful for a device under test (or portions thereof) having untestable structures proximate primary inputs of the device under test.

Figure 13:
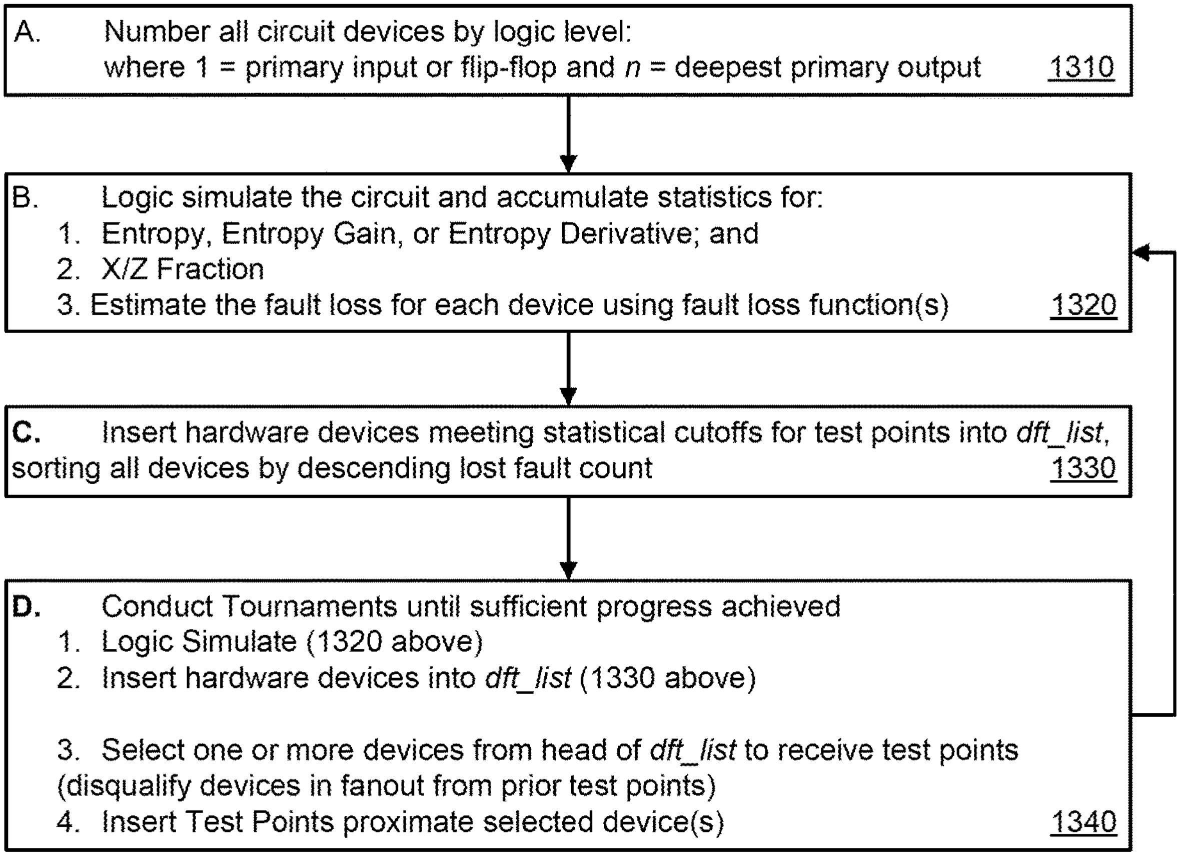

FIG. 13 depicts modifications to the method of FIG. 10 according to various embodiments. Specifically, the method 1300 of FIG. 13 modifies the method 1000 of FIG. 10 in that all decisions about siting test points are based on descending estimated lost fault count.

At step 1310, all of the circuit devices are numbered by logic level from 1 through n, wherein 1=a primary input or flip-flop, and n is equal to a deepest primary output.

At step 1320, logic simulations are performed on the circuit and devices contained therein to accumulate statistics associated with Logic simulate the circuit and accumulate statistics associated with (1) Entropy, Entropy Gain, and/or Entropy Derivative; and (2) X/Z Fraction such as discussed above. Further, an estimate is made of the fault loss for each device using fault loss functions as described in more detail above.

At step 1330, hardware devices meeting statistical cutoffs for test points are inserted into the dft_list, wherein all devices are sorted by descending lost fault count.

At step 1340, "tournaments" are conducted until sufficient progress is achieved (e.g., there is little or no progress or improvement made from one tournament to the next). That is, for each iteration of simulation (step 1320) and insertion of hardware devices into the dft_list (step 1330) one or more devices from the head of dft_list are selected to receive test points (disqualify devices in fanout from prior test points) and test points are inserted proximate the selected device(s).

FIG. 13 generally depicts a methodology denoted by the inventor as universal fault loss optimization, which methodology is deemed by the inventor to be especially useful for a device under test (or portions thereof) having a relatively large or even huge number of highly testable (easy to test) circuits.

Figure 14:
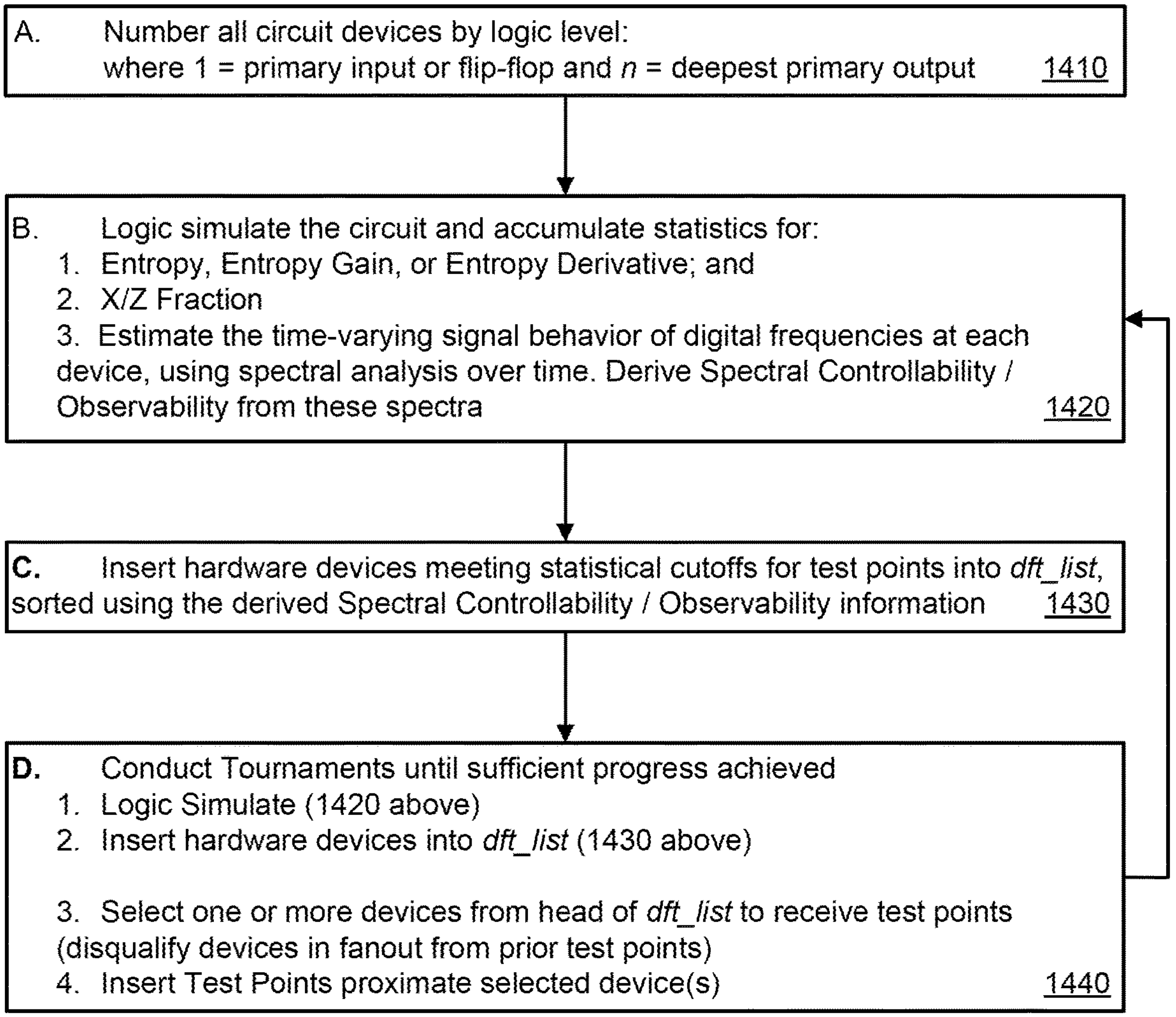

FIG. 14 depicts modifications to the method of FIG. 10 according to various embodiments. Specifically, the method 1400 of FIG. 14 modifies the method 1000 of FIG. 10 in that all decisions about siting test points are based jointly on the entropy measures and on the spectral controllability and/or observability measures that incorporate the time-domain circuit signal behavior.

At step 1410, all of the circuit devices are numbered by logic level from 1 through n, wherein 1=a primary input or flip-flop, and n is equal to a deepest primary output.

At step 1420, logic simulations are performed on the circuit and devices contained therein to accumulate statistics associated with Logic simulate the circuit and accumulate statistics associated with (1) Entropy, Entropy Gain, and/or Entropy Derivative; and (2) X/Z Fraction such as discussed above. Further, estimates are made of time-varying signal behavior of digital frequencies at each device, using spectral analysis over time (though this does slow test point selection down by an order of magnitude). These estimates are used to derive Spectral Controllability/Observability information pertaining to the devices.

At step 1430, hardware devices meeting statistical cutoffs for test points are inserted into the dft_list, sorted using the derived Spectral Controllability/Observability information. At step 1440, "tournaments" are conducted until sufficient progress is achieved (e.g., there is little or no progress or improvement made from one tournament to the next). That is, for each iteration of simulation (step 1420) and insertion of hardware devices into the dft_list (step 1430) one or more devices from the head of dft_list are selected to receive test points (disqualify devices in fanout from prior test points) and test points are inserted proximate the selected device(s).

FIG. 14 generally depicts a methodology denoted by the inventor as spectral analysis optimization, which methodology is deemed by the inventor to be especially useful for a device under test (or portions thereof) having a relatively large or even huge number of hard-to-test sequential circuits.

Tournaments. The various methodologies of FIGS. 10-14 (and other figures/descriptions within this specification) contemplate "tournaments" and the like which are terminated when there is little or no progress or improvement made from one tournament to the next. The measure of progress may be made using various mechanisms. For example, in various embodiments entropy-based tournaments may be deemed to terminate when one or more of these conditions happen: (1) a predefined or practicable test point count is exhausted; (2) no more suitable test point sites remain/exist; (3) the Entropy distribution for the netlist (e.g., #devices vs. Entropy value) ceases to improve; and/or (4) other conditions as discussed above.

One or more of the methodologies described herein (and implemented by, for example, the Entropy™ tool discussed above) uses a gradient descent optimization algorithm that first stimulates the circuit with vectors (warmup) and creates a histogram of the Entropy measures of each circuit node (derived from probabilities). Then, for a user-specified number of tournaments, the method: (1) finds the n circuit nodes with lowest entropy; (2) inserts m test points to improve the circuit testability; (3) stimulates the circuit with additional vectors and updates statistics; (4) produces a new Entropy Histogram and Signal Activity Histogram; (5) and checks for the stopping criteria—Typically a limit on the # of test points to insert, or elimination of all low-entropy (<0.18) signals, or a lack of improvement in the Histogram.

The Entropy™ tool or other embodiments configured as described herein may be realized using a 64 concurrent machine, high-speed logic simulator, wherein a Verilog compiler handles designs with millions of logic gates and 100's of memories. In this configuration, the tool uses a binary data base that is produced during the first design compilation, supports arbitrarily many Verilog libraries, can specify your library standard cell naming and delay conventions to compiler, and has a symbol table defining all signals that is searchable with hashing. Also addressed are test data compression support needs, untestability caused by test point insertion, and ability to scale to handle very very large circuit designs.

Various embodiments contemplate an expansion of Entropy Derivative Measure to further reduce # of test points while increasing test coverage and minimizing hardware, fault loss estimation, optimization to reduce fault loss, optimization by spectral analysis, adjustment to fanin/fanout cone restriction for test point insertion to reduce the # of Entropy tournaments, speeding up the Test Point insertion algorithm, and other improvements.

It is noted that many of the various hardware, software, testing systems, and other mechanisms, devices, systems, structures, and the like as described in U.S. Pat. No. 8,164,345 are improved upon using the various embodiments described herein.

Various embodiments described herein provide a method to insert test points, testing structures, and various other testability hardware into circuits (e.g., such as by using insertion techniques as disclosed in U.S. Pat. No. 8,164,345), with the additional capability as disclosed herein of simulating latches in the circuit during the tournaments, and scanning the latches, to select test point sites.

Various embodiments described herein provide a method and a system for using logic simulation to estimate signal probabilities, entropy, and the X/Z state counts for a given signal using a series of tournaments during which the simulation is corrected by statistical unbiasing.

Various embodiments described herein provide a method and a search algorithm to discover all X/Z signal generators in a circuit, such as by using the methods of Algorithm 1 and/or other methods as described herein.

Various embodiments described herein provide a method and a search algorithm to discover all X/Z signal generators in a circuit using or further using the methods of Algorithm 1 and/or other methods as described herein, and any other logic simulation method that estimates signal probabilities, entropy, and the X/Z state counts.

Various embodiments described herein provide a method and a search algorithm to estimate untestable faults caused by X/Z generators using or further using the methods of Algorithm 2 and/or other methods as described herein to discover the X/Z signal generators.

Various embodiments described herein provide a method and a search algorithm to estimate untestable faults caused by X/Z generators using or further using the methods of Algorithm 2 and/or other methods as described herein to discover the X/Z signal generators.

Various embodiments described herein provide a method and a search algorithm to estimate signal probabilities, entropy, and the number of faults that are made untestable by a given signal being unobservable using or further using the methods of Algorithm 3 and/or other methods described herein.

Various embodiments described herein provide a method and a search algorithm to estimate signal probabilities, entropy, and the number of faults that are made untestable by a given signal being unobservable using or further using the methods of Algorithm 3 and/or other methods described herein.

Various embodiments described herein provide a method of sorting the test point candidate list to determine the order of test point insertion. For example, sorting blocker portion (the beginning) of the test point candidate list by untestable_fault count within X/Z_fraction, both in descending sequence. Sorting the uncontrollable/unobservable test point portion (the tail) of the test point candidate list by untestable_fault count (in descending order) within Entropy measure (in ascending order). Inserting the test points into the circuit in the order specified by the test point list.

Various embodiments described herein provide an automatic method using or further using the methods of Algorithm 4 and/or other methods described herein to insert X/Z signal blockers, test points, and/or scan flip-flops using the fraction of the time a signal is in the X/Z state, and within that using untestable fault estimates. These and other embodiments may use a Gradient Descent, greedy optimization, and/or optimal Linear Programing optimization.

Various embodiments described herein use or further use the methods of Algorithm 5 and/or other methods described herein to insert X/Z signal blockers, test points, and/or scan flip-flops using the fraction of the time a signal is in the X/Z state, and within that using untestable fault estimates. These and other embodiments may use a Gradient Descent, greedy optimization, and/or optimal Linear Programing optimization.

Various embodiments described herein may be used to build upon known methods to estimate the count of untestable faults caused by a particular signal line.

Various embodiments described herein may be used to build upon known methods to perform logic simulation and estimate the number of X/Z values on each signal line.

Various embodiments described herein may use Entropy Gain or Entropy Derivative measures to break ties in Entropy values during test point insertion.

Various embodiments described herein may be used individually or in various combinations.

Various modifications may be made to the systems, methods, apparatus, mechanisms, techniques, and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

Various computing and/or processing functions as described herein may be performed using standard computing techniques, such as via a special purpose or general-purpose computer configured to perform the computing and/or processing function and including processing, memory, and input/output (I/O) circuitry and the like. For example, a controller or processor may be configured to perform various computing and/or processing functions in response to computer instructions stored in a non-transitory computer readable memory. As such, the various functions depicted and described herein may be implemented at the elements or portions thereof as hardware or a combination of software and hardware, such as by using a general-purpose computer, one or more application specific integrated circuits (ASIC), or any other hardware equivalents or combinations thereof. In various embodiments, computer instructions associated with a function of an element or portion thereof are loaded into a respective memory and executed by a respective processor to implement the respective functions as discussed herein. Thus, various functions, elements and/or modules described herein, or portions thereof, may be implemented as a computer program product wherein computer instructions, when processed by a computing device, adapt the operation of the computing device such that the methods or techniques described herein are invoked or otherwise provided. Instructions for invoking the inventive methods may be stored in tangible and non-transitory computer readable medium such as fixed or removable media or memory or stored within a memory within a computing device operating according to the instructions.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof.

What is claimed is:

1. A method for inserting testing structure into a circuit under test (CUT), comprising:
- locating X/Z generator sites in the CUT to form thereby a blocker_candidates list;
- estimating a number of untestable faults for each X/Z generator;
- optimizing design for testability (DFT) hardware insertion using the estimate of the number of untestable faults due to X/Z generators as an optimization cost function; and
- inserting appropriate testing structure into one or more test point locations of the CUT.

2. The method of claim 1, wherein DFT hardware insertion comprises:
- setting a test hardware limit;
- calculating a number of logic gates, a number of flip-flops, and a number of connected components in the CUT;
- simulating a scan flush test to initialize all scan flip-flops;
- logic simulating the CUT with random input vectors and calculating signal probabilities and signal entropies;
- selecting a test point site with a lowest signal entropy and inserting a test point or scan flip-flop at the test point site in the CUT;
- determining if the test hardware limit is reached and stopping if the test hardware limit is reached;
- logic simulating the CUT with a number of random input vectors and recalculating signal probabilities and signal entropies and the connected components; and
- returning to the step of selecting a test point site.

3. The method of claim 1, further comprising:
- estimating a number of untestable faults for each unobservable logic device in the CUT; and
- optimizing the DFT hardware insertion using the estimate of the number of untestable faults due to uncontrollable/unobservable signals as an optimization cost function.

4. The method of claim 3, wherein the number of untestable faults is estimated only for those logic device inputs with a single fanout.

5. The method of claim 3, wherein estimating a number of untestable faults for each unobservable logic device in the digital circuit comprises:
- generating a list of test_point_candidates and its corresponding lists X/Z_fractions and untestable_faults; and
- select uncontrollable and unobservable test points to add to the end of the blocker_candidates list and its corresponding lists X/Z_fractions, untestable_faults, and entropy values.

6. The method of claim 1, wherein locating X/Z generator sites in the CUT to form thereby a list of blocker candidates comprises:
- logically simulating the devices within the CUT to accumulate respective statistics for X/Z fraction and at least one of entropy, entropy gain, and entropy derivative; and
- selecting as X/Z generator sites those devices within the CUT meeting one or more statistical cutoffs for test points.

7. The method of claim 1, wherein locating X/Z generator sites in the CUT to form thereby a blocker_candidates list comprises:
- conducting a series of tournaments to locate the n worst X/Z generators, wherein the tournaments are ended when a pre-specified number of test points have been inserted, wherein each tournament comprises:
  - estimating the probabilities of Logic 0 and Logic 1 at every device output for the devices within the CUT;
  - examining substantially every flip-flop in the scan chains in the circuit with X/Z on its Q or $\overline{Q}$ outputs greater than a xzthreshold percentage and, for every flip-flop exhibiting X/Z signals entering its respective inputs that are not SI or SE inputs, then insert thereat an X-blocker.

8. The method of claim 7, further comprising generating a list of test_point_candidates and its corresponding lists X/Z_fractions and untestable_faults.

9. The method of claim 1, wherein the tournaments are ended when a testability measure of the entire circuit rises above a pre-specified threshold or distribution.

10. A method for inserting testing structure into a circuit under test (CUT), comprising:
- numbering the circuit devices of the CUT by logic level from 1 through n, wherein 1=a primary input or flip-flop, and n is equal to a deepest primary output;
- conducting tournaments until incremental improvement between tournaments is below a threshold level, each tournament comprising:
- performing logic simulations on the CUT to accumulate statistics associated with X/Z Fraction and entropy measure, wherein entropy measure comprises at least one of entropy, entropy gain, and entropy derivative;
- inserting, into a dft_list, those circuit devices meeting statistical cutoffs for test points;
- sorting the dft_list according to descending X/Z fraction for flop-flops and latches with initialization problems, and then for other circuit devices according to entropy measure;

selecting, from the top of the dft_list, one or more circuit devices of the CUT to receive testing structure thereat; and inserting testing structure at each of the selected one or more circuit devices of the CUT.

11. The method of claim 10, wherein circuit devices in fanout from prior test points are disqualified from being selected to receive testing structure thereat.

12. The method of claim 11, wherein:

performing logic simulations further comprises estimating a fault loss for each circuit device using at least one fault loss function; and flop-flops and latches within the dft_list are sorted by descending fault loss count.

13. The method of claim 12, wherein all circuit devices within the dft_list are sorted by descending fault loss count.

14. The method of claim 11, wherein:

flop-flops and latches within the dft_list are sorted lowest level number and then by lowest entropy measure.

15. The method of claim 11, wherein:

performing logic simulations further comprises estimating time-varying signal behavior of digital frequencies at each device using spectral analysis over time to derive thereby spectral controllability/observability information; and all circuit devices within the dft_list are sorted by respective derived spectral controllability/observability information.

16. A computer implemented tool for inserting testing structure into a circuit under test (CUT), the tool configured for implementing a method comprising:

numbering the circuit devices of the CUT by logic level from 1 through n, wherein 1=a primary input or flip-flop, and n is equal to a deepest primary output;

conducting tournaments until incremental improvement between tournaments is below a threshold level, each tournament comprising:

performing logic simulations on the CUT to accumulate statistics associated with X/Z Fraction and entropy measure, wherein entropy measure comprises at least one of entropy, entropy gain, and entropy derivative;

inserting, into a dft_list, those circuit devices meeting statistical cutoffs for test points;

sorting the dft_list according to descending X/Z fraction for flop-flops and latches with initialization problems, and then for other circuit devices according to entropy measure;

selecting, from the top of the dft_list, one or more circuit devices of the CUT to receive testing structure thereat; and inserting testing structure at each of the selected one or more circuit devices of the CUT.

17. The computer implemented tool of claim 16, configured in that circuit devices in fanout from prior test points are disqualified from being selected to receive testing structure thereat.

18. The computer implemented tool of claim 17, configured in that:

performing logic simulations further comprises estimating a fault loss for each circuit device using at least one fault loss function; and flop-flops and latches within the dft_list are sorted by descending fault loss count.

19. The computer implemented tool of claim 17, configured in that:

flop-flops and latches within the dft_list are sorted lowest level number and then by lowest entropy measure.

20. The computer implemented tool of claim 17, configured in that all circuit devices within the dft_list are sorted by descending fault loss count.

21. The computer implemented tool of claim 17, configured in that:

performing logic simulations further comprises estimating time-varying signal behavior of digital frequencies at each device using spectral analysis over time to derive thereby spectral controllability/observability information; and all circuit devices within the dft_list are sorted by respective derived spectral controllability/observability information.

* * * * *